(12) United States Patent
Katsuta

(10) Patent No.: US 10,032,801 B2
(45) Date of Patent: Jul. 24, 2018

(54) DISPLAY APPARATUS

(71) Applicant: Japan Display Inc., Minato-ku (JP)

(72) Inventor: Tadayoshi Katsuta, Tokyo (JP)

(73) Assignee: Japan Display Inc., Minato-ku (JP)

( * ) Notice: Subject to any disclaimer, the term of this patent is extended or adjusted under 35 U.S.C. 154(b) by 180 days.

(21) Appl. No.: 15/042,826

(22) Filed: Feb. 12, 2016

(65) Prior Publication Data

US 2016/0247825 A1    Aug. 25, 2016

(30) Foreign Application Priority Data

Feb. 19, 2015 (JP) ................. 2015-031144

(51) Int. Cl.
| | |
|---|---|
| G02F 1/136 | (2006.01) |
| H01L 27/12 | (2006.01) |
| G02F 1/1335 | (2006.01) |
| G02F 1/1339 | (2006.01) |
| G02F 1/1343 | (2006.01) |
| G02F 1/1345 | (2006.01) |
| G02F 1/1362 | (2006.01) |
| H01L 29/786 | (2006.01) |

(52) U.S. Cl.
CPC ........ H01L 27/124 (2013.01); G02F 1/13394 (2013.01); G02F 1/13454 (2013.01); G02F 1/133512 (2013.01); G02F 1/134363 (2013.01); G02F 1/136286 (2013.01); H01L 27/1222 (2013.01); G02F 2001/13456 (2013.01); H01L 29/78645 (2013.01)

(58) Field of Classification Search
CPC .............. H01L 27/1222; H01L 27/124; H01L 29/78645; G02F 1/13454; G02F 1/136286; G02F 1/133512; G02F 1/13394; G02F 1/134363; G02F 29/78645; G02F 2001/13456
USPC .................................................... 349/43, 139
See application file for complete search history.

(56) References Cited

U.S. PATENT DOCUMENTS

| | | | |
|---|---|---|---|
| 5,877,512 A * | 3/1999 | Kim .................. | G02F 1/136286 |
| | | | 257/57 |
| 7,864,284 B2 | 1/2011 | Morii et al. | |
| 8,045,073 B2 | 10/2011 | Itsumi et al. | |
| 8,836,613 B2 * | 9/2014 | Kim .................. | H04N 13/0434 |
| | | | 345/4 |

(Continued)

FOREIGN PATENT DOCUMENTS

| | | |
|---|---|---|
| JP | 2007-3779 | 1/2007 |
| WO | WO 2008/081624 A1 | 7/2008 |

*Primary Examiner* — Hoan C Nguyen
(74) *Attorney, Agent, or Firm* — Oblon, McClelland, Maier & Neustadt, L.L.P.

(57) ABSTRACT

A load related to a scanning line is decreased and a load related to a common electrode is decreased without decrease in an aperture ratio of each pixel. A display apparatus has a red sub-pixel and a green sub-pixel. A distance in the Y-axis direction between a pedestal electrode and a scanning line that drives a transistor in a plan view in the red sub-pixel is longer than a distance in the Y-axis direction between a pedestal electrode and a scanning line that drives a transistor in a plan view in the green sub-pixel. Furthermore, a superposed width of a light shielding film with a red pixel region in the Y-axis direction is larger than a superposed width of the light shielding film with a green pixel region in the Y-axis direction.

11 Claims, 17 Drawing Sheets

(56) References Cited

U.S. PATENT DOCUMENTS

2013/0342781 A1* 12/2013 Lee .................. G02F 1/1368
  349/46
2016/0197098 A1* 7/2016 Xian ................ H01L 27/1222
  257/72

* cited by examiner

DISPLAY APPARATUS

CROSS-REFERENCE TO RELATED APPLICATION

The present application claims priority from Japanese Patent Application No. 2015-31144 filed on Feb. 19, 2015, the content of which is hereby incorporated by reference into this application.

TECHNICAL FIELD OF THE INVENTION

The present invention relates to a display apparatus. For example, the present invention relates to a technique effectively applied to a display apparatus having a plurality of pixels provided in a display region.

BACKGROUND OF THE INVENTION

There are display apparatuses that display an image by supplying, to a plurality of pixels in a display region, scanning signal and pixel signals via a plurality of scanning lines and a plurality of signal lines, respectively. In such a display apparatus, a control device required for display operation such as a gate driver or a source driver is provided in a peripheral region in periphery of the display region.

A plurality of pixels are formed by intersection of a plurality of scanning lines and a plurality of signal lines. Each pixel has a transistor, a pixel electrode, and a common electrode. Furthermore, the display apparatus has a light shielding film having a light shielding property. The light shielding film is superposed with the scanning lines and the signal lines. The proportion of a portion that is not covered with the light shielding film in the pixel corresponds to an aperture ratio. Furthermore, the display apparatus has a spacer that keeps a distance between a pair of substrates.

For example, Japanese Patent Application Laid-Open Publication No. 2007-003779 (Patent Document 1) describes a technique of a display apparatus in which a columnar spacer is formed in a green pixel among red, green, and blue pixels, and in which a light shielding portion is provided in a region in the vicinity of the columnar spacer. And, WO 2008/081624 (Patent Document 2) describes a technique of a display apparatus in which a columnar spacer structure is formed in a red pixel among three pixels of red, green, and blue pixels, and in which an aperture ratio of the red pixel is smaller than those of the green and blue pixels.

SUMMARY OF THE INVENTION

As such a display apparatus, a display apparatus in which a pedestal electrode that connects a pixel electrode and a transistor is provided in each pixel is cited. The pedestal electrode is made of, for example, metal, and overlaps a scanning line in a plan view in some cases.

In such a case, in a pixel farther from a gate driver, parasitic capacitance or wiring resistance related to the scanning line is larger, and load related to the scanning line is larger. Furthermore, in a pixel farther from a control device, parasitic capacitance or wiring resistance related to a common electrode is larger, and load related to the common electrode is larger.

Such tendency that the load related to the scanning line is larger in the pixel farther from the gate driver and such tendency that the load related to the common electrode is larger in the pixel farther from the control device described above are more remarkable as resolution of the pixel is higher or a size of a display region is larger.

Furthermore, it is desirable that the pedestal electrode is covered with a light shielding film. Therefore, there is a risk of a decrease in aperture ratio of each pixel depending on the layout of the pedestal electrode.

The present invention has been made in order to solve the problems of the conventional techniques as described above, and an object of the present invention is to provide a display apparatus in which load related to a scanning line is decreased and load related to a common electrode is decreased without decreasing an aperture ratio of each pixel even when resolution of the display apparatus is increased or even when a size of a display region is increased.

The typical ones of the inventions disclosed in the present application will be briefly described as follows.

A display apparatus according to one aspect of the present invention includes: a plurality of first signal lines to which a first signal related to an image is supplied; and a plurality of second signal lines to which a second signal that is related to an image and is different from the first signal is supplied. The display apparatus includes: a first pixel region and a second pixel region that are sectioned by intersection between the plurality of first signal lines and the plurality of second signal lines; a first transistor provided in the first pixel region and driven by the first signal line and the second signal line; and a second transistor provided in the second pixel region and driven by the first signal line and the second signal line. Furthermore, the display apparatus includes: a first pixel electrode provided in the first pixel region; a second pixel electrode provided in the second pixel region; a first conductive wiring that electrically connects the first transistor and the first pixel electrode; and a second conductive wiring that electrically connects the second transistor and the second pixel electrode. Furthermore, the display apparatus includes: a first conductive electrode provided between the first conductive wiring and the first transistor; and a second conductive electrode provided between the second conductive wiring and the second transistor. Furthermore, the display apparatus includes: an insulating film provided between the first pixel electrode and the first transistor, and between the second pixel electrode and the second transistor; and alight shielding film that is superposed with the first signal line, the first conductive wiring, the second conductive wiring, the first conductive electrode, and the second conductive electrode. The insulating film has a first opening and a second opening formed therein, the first conductive wiring and the first conductive electrode are provided inside the first opening in a plan view, and the second conductive wiring and the second conductive electrode are provided inside the second opening in a plan view. The plurality of first signal lines extend in a first direction in a plan view. The first conductive electrode is adjacent to the first signal line driving the first transistor on a first side in a second direction that intersects the first direction in a plan view, and the second conductive electrode is adjacent to the first signal line driving the second transistor on the first side in a plan view. A distance in the second direction between the first conductive electrode and the first signal line that drives the first transistor in a plan view is longer than a distance in the second direction between the second conductive electrode and the first signal line that drives the second transistor in a plan view. A superposed width of the light shielding film with the first pixel region in the second direction is larger than a superposed width of the light shielding film with the second pixel region in the second direction.

In another aspect, the display apparatus may include a plurality of first pixels and a second pixel. The first pixel may include the first pixel region, the first conductive electrode, the first conductive wiring, the first transistor, and the first opening. The second pixel may include the second pixel region, the second conductive electrode, the second conductive wiring, the second transistor, and the second opening. The plurality of first pixels may be aligned in the first direction, the second pixel may be adjacent to one first pixel that is arranged at an end of the layout of the plurality of first pixels, the second signal line may be interposed between two of the first pixels adjacent to each other, and the second signal line may be interposed between the second pixel and the first pixel adjacent to the second pixel.

In another aspect, the first signal line that drives the first transistor included in the first pixel may be arranged on a side of the first conductive electrode opposite to the first side, and include a first extension that extends in the first direction. Furthermore, the first signal line that drives the second transistor included in the second pixel may be arranged on a side of the second conductive electrode opposite to the first side, and include a second extension that extends in the first direction. The width of the second extension in the second direction may be smaller than the width of the first extension in the second direction, and a first side end portion of the first extension on the first side may be provided closer to the first side than a second side end portion of the second extension on the first side.

In another aspect, the display apparatus may include: a first substrate; a second substrate arranged at a position facing the first substrate; and a spacer that is provided between the first substrate and the second substrate and that keeps a distance between the first substrate and the second substrate. The plurality of first pixels and the second pixel may be provided on the first substrate, and the spacer may overlap the second signal line of a portion interposed between two of the first pixels adjacent to each other in a plan view.

In another aspect, the spacer may overlap the first signal line connected to two of the first transistors included in two of the first pixels adjacent to each other in a plan view, respectively. Furthermore, the center of the spacer in the second direction may be arranged on the first side of the first signal line in the second direction that is connected to two of the first transistors included in two of the first pixels adjacent to each other, respectively.

In another aspect, a length of the spacer in the first direction may be larger than a width of the spacer in the second direction.

In another aspect, the light shielding film may include: a first light shielding portion that is superposed with the spacer, the first conductive wiring, and the first conductive electrode in a plan view; and a second light shielding portion that is superposed with the second conductive wiring and the second conductive electrode included in the second pixel. A third side end portion of the first light shielding portion on the first side may extend closer to the first side than a fourth side end portion of the second light shielding portion on the first side, and a fifth side end portion of the first light shielding portion on the side opposite to the first side may extend closer to the side opposite to the first side than a sixth side end portion of the second light shielding portion on the side opposite to the first side. A distance in the second direction between the third side end portion and the fourth side end portion may be larger than a distance in the second direction between the fifth side end portion and the sixth side end portion.

In another aspect, the first pixel may display white or blue, and the second pixel may display green.

In another aspect, the length of the second conductive wiring in the second direction may be shorter than that of the first conductive wiring in the second direction, or the length of the second conductive electrode in the second direction may be shorter than that of the first conductive electrode in the second direction.

In another aspect, the display apparatus may include a common electrode that forms an electric field between the first pixel electrode and the second pixel electrode. The common electrode may be superposed with the first signal line, and the common electrode may also serve as a position coordinate detection electrode that detects contact or approach of an object.

BRIEF DESCRIPTIONS OF THE DRAWINGS

DESCRIPTIONS OF THE PREFERRED EMBODIMENTS

The following is explanation for each embodiment of the present invention with reference to drawings.

Note that disclosure is merely one example, and appropriate change with keeping the concept of the present invention which can be easily thought up by those who skilled in the art is obviously contained in the scope of the present invention. Also, in order to make the clear description, the drawings are illustrated more schematically for a width, a thickness, a shape, and others of each portion than those in an actual aspect in some cases. However, they are merely examples, and do not restrict the interpretation of the present invention.

In the present specification and each drawing, similar elements to those described earlier for the already-described drawings are denoted by the same reference symbols, and detailed description for them is appropriately omitted in some cases.

Also, in some drawings used in the embodiments, hatching added to distinguish the structures is omitted depending on the drawings in some cases.

First Embodiment

First, an example in which a display apparatus is applied to a liquid crystal display apparatus is described as a first embodiment.

<Module>

Figure 1:
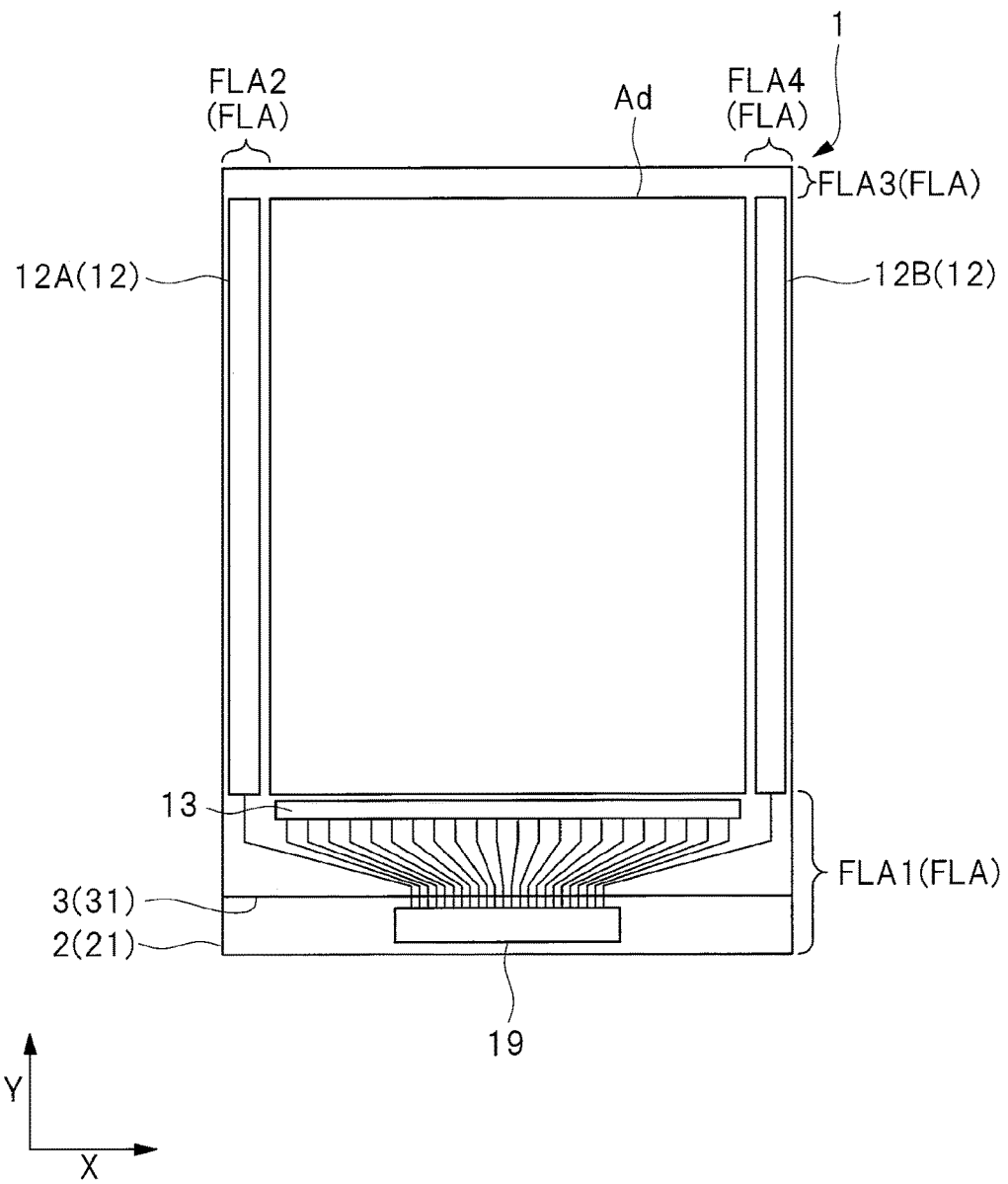
FIG. 1 is a plan view illustrating an example of a module on which a display apparatus according to the first embodiment is mounted.

FIG. 1 is a plan view illustrating an example of a module in which the display apparatus according to the first embodiment is mounted.

As illustrated in FIG. 1, a display apparatus 1 has an array substrate 2 including a substrate 21 and an opposite substrate 3 including a substrate 31.

The substrate 21 includes a display region Ad and a frame region FLA. The display region Ad is a region on an upper surface 21a side (see FIG. 2 that will be described later) that serves as a main surface of the substrate 21 and is a region in which a plurality of pixels Px (see FIG. 4 that will be described later) are provided. That is, the display region Ad is a region in which an image is displayed. The frame region FLA is a region on the upper surface 21a side (see FIG. 2 that will be described later) that serves as a main surface of the substrate 21 and is an outer peripheral region of the substrate 21 further than the display region Ad. That is, the frame region FLA is a region in which no image is displayed.

Here, it is assumed that two directions intersecting each other or preferably orthogonal to each other in the upper surface 21a serving as the main surface of the substrate 21 are an X-axis direction which is a first direction and a Y-axis direction which is a second direction. In the example illustrated in FIG. 1, the substrate 21 has two sides extending in the X-axis direction and two sides extending in the Y-axis direction and has a rectangular shape in a plan view. Accordingly, in the example illustrated in FIG. 1, the frame region FLA is a frame-like region in periphery of the display region Ad.

Note that the expression "in a plan view" as used herein refers to a case where the display apparatus 1 is viewed from a direction perpendicular to the upper surface 21a (see FIG. 2 that will be described later) serving as the main surface of the substrate 21. Hereinafter, the expression "on the substrate 21" is sometimes used instead of the expression "on the upper surface 21a serving as the main surface of the substrate 21".

The term "the positive side in the X-axis direction" in the specification of the present application refers to a side toward which the arrow indicating the X-axis direction in FIG. 1 extends, and the term "the negative side in the X-axis direction" refers to a side opposite to the "positive side". The same goes for the positive side and the negative side in the Y-axis direction.

Further, in the specification of the present application, it is assumed that a direction in which an insulating film IF and a transistor Tr are stacked on the substrate 21 is an "upper" direction, and that a direction opposite to the upper direction is a "lower" direction, unless otherwise specified.

A COG (Chip On Glass) 19 is mounted on the substrate 21. The COG 19 is an IC (Integrated Circuit) chip mounted on the substrate 21 and is a control device in which each circuit required for display operation is embedded.

A source driver 13 is provided on the substrate 21. The source driver 13 may be embedded in the COG 19.

Gate drivers 12A and 12B serving as the gate driver 12 are provided on the substrate 21. The gate drivers 12A and 12B are provided in the frame region FLA.

Here, it is assumed that a region on the negative side of the display region Ad in the Y-axis direction in the frame region FLA is a frame region FLA1, and that a region on the negative side of the display region Ad in the X-axis direction in the frame region FLA is a frame region FLA2. Furthermore, it is assumed that a region on the positive side of the display region Ad in the Y-axis direction in the frame region FLA is a frame region FLA3, and that a region on the positive side of the display region Ad in the X-axis direction in the frame region FLA is a frame region FLA4.

At this time, the gate driver 12A is provided in the frame region FLA2, and the gate driver 12B is provided in the frame region FLA4. The gate drivers 12A and 12B are provided so as to sandwich the display region Ad. As described later with reference to FIG. 3, a large number of pixels Px each formed of a plurality of sub-pixels Sx are arranged in a matrix form (in rows and columns) in the display region Ad.

<Display Apparatus>

Figure 2:
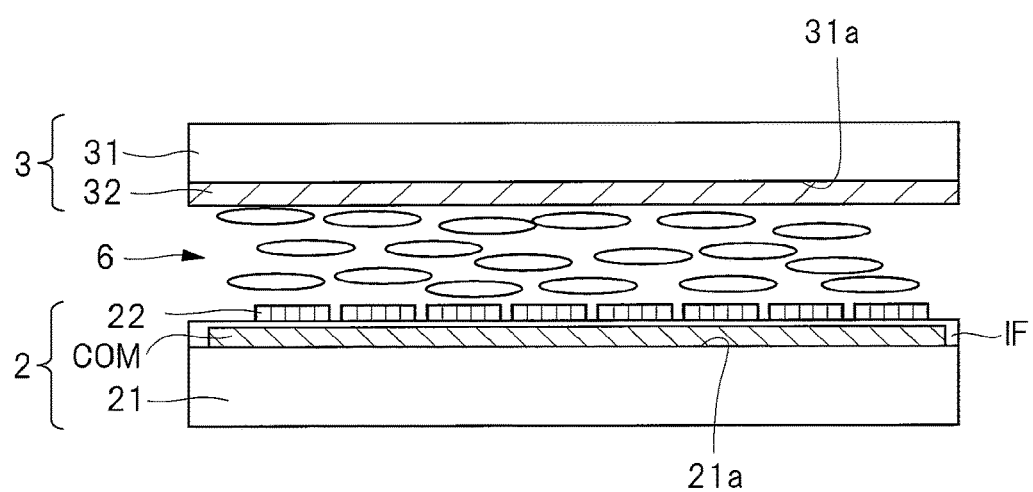
FIG. 2 is a cross-sectional view illustrating the display apparatus according to the first embodiment.
Figure 3:
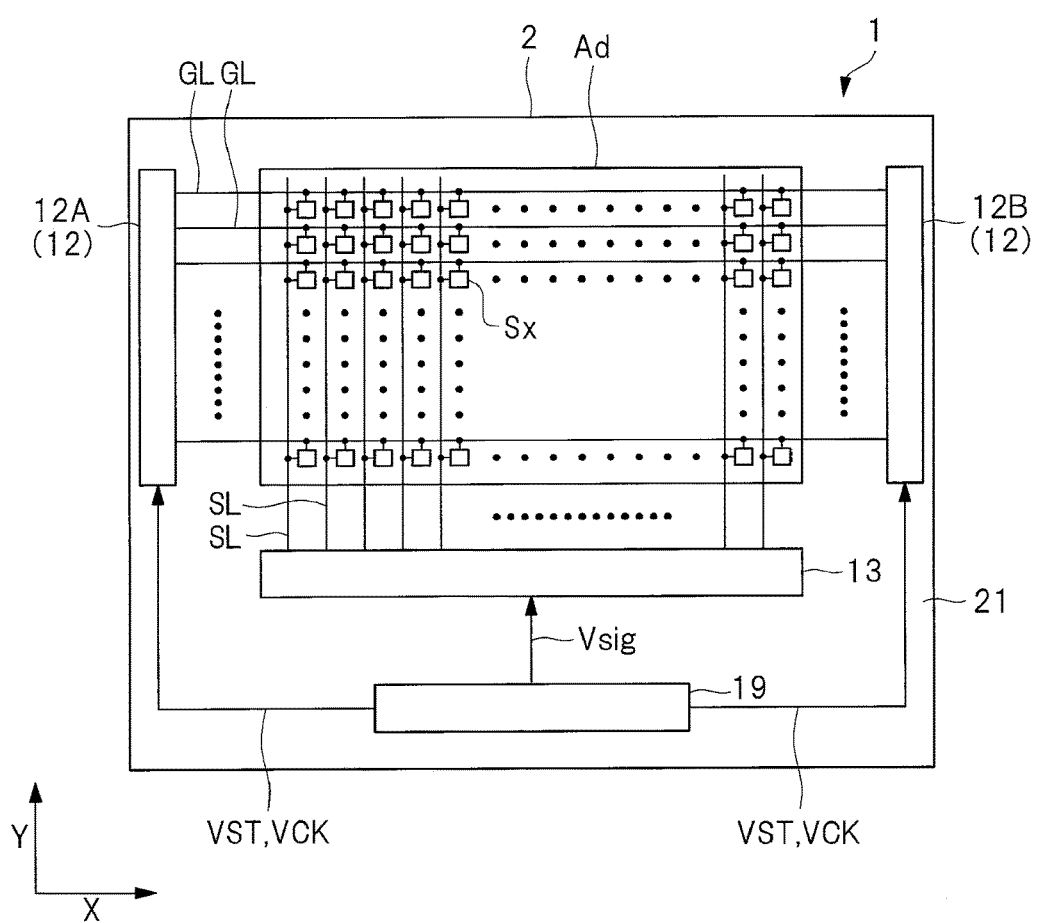
FIG. 3 is a circuit block diagram illustrating the display apparatus according to the first embodiment.
Figure 4:
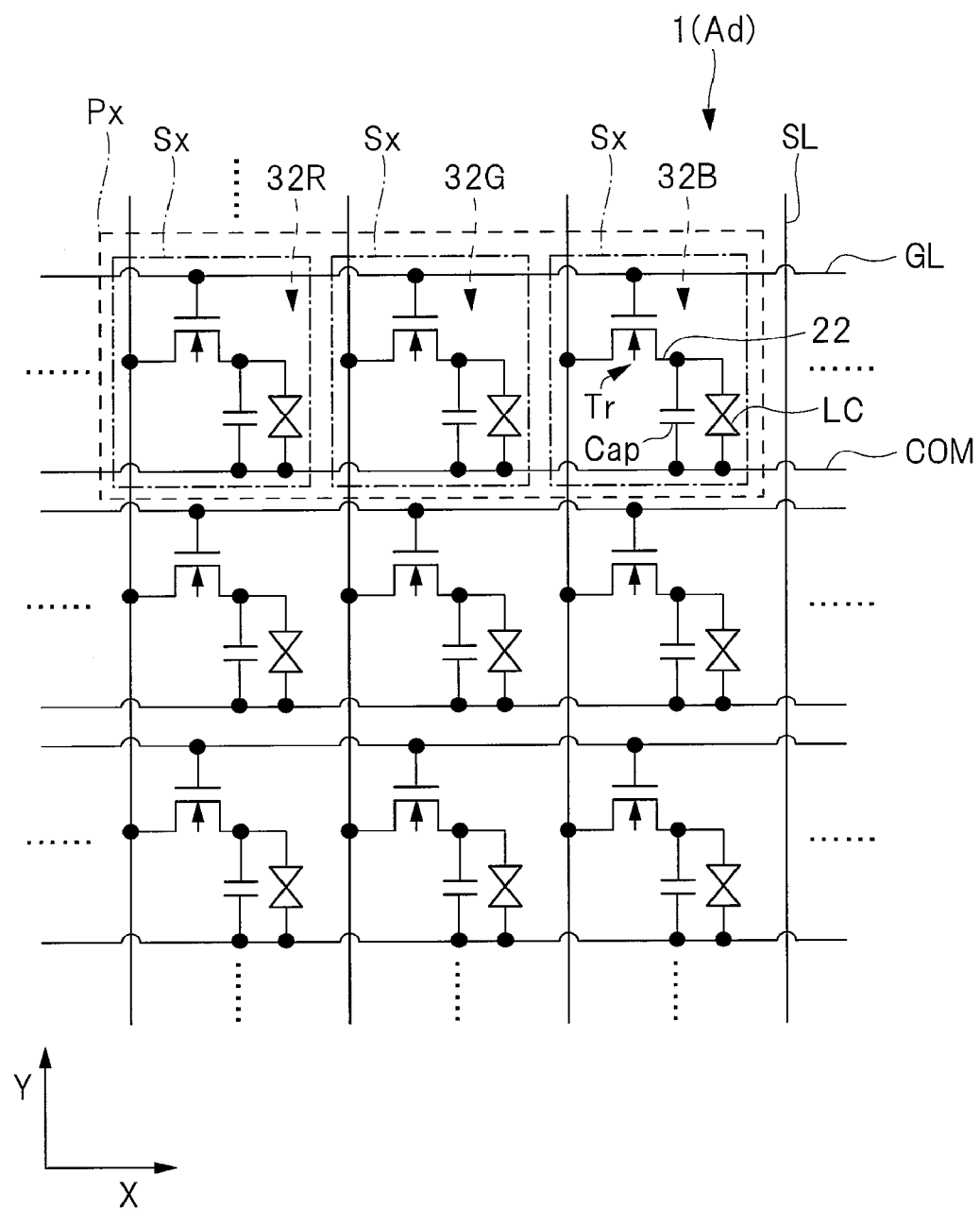
FIG. 4 is a circuit diagram illustrating the display apparatus according to the first embodiment.

Next, with reference to FIGS. 1, 2 and 4, an example of a configuration of the display apparatus according to the present first embodiment will be described in detail. FIG. 2 is a cross-sectional view illustrating the display apparatus according to the first embodiment. FIG. 3 is a circuit block diagram illustrating the display apparatus according to the first embodiment. FIG. 4 is a circuit diagram illustrating the display apparatus according to the first embodiment.

As illustrated in FIG. 2, the display apparatus 1 (see FIG. 1) has the array substrate 2, the opposite substrate 3, and a liquid crystal layer 6. The opposite substrate 3 is arranged so as to face the array substrate 2 so that an upper surface of the array substrate 2 faces a lower surface of the opposite substrate 3. The liquid crystal layer 6 is provided between the array substrate 2 and the opposite substrate 3.

The array substrate 2 has the insulating substrate 21. The opposite substrate 3 has the insulating substrate 31. The substrate 31 has an upper surface and a lower surface opposite to the upper surface and is arranged so as to face the substrate 21 so that the upper surface of the substrate 21 and the lower surface of the substrate 31 face each other. The liquid crystal layer 6 is sandwiched between the upper surface of the substrate 21 and the lower surface of the substrate 31. Note that the upper surface of the substrate 21 is referred to as the upper surface 21a as described above. The lower surface of the substrate 31 is referred to as a lower surface 31a.

As illustrated in FIG. 3, the array substrate 2 has the display region Ad, the COG 19, the gate drivers 12A and 12B, and the source driver 13 on the substrate 21.

As illustrated in FIGS. 3 and 4, the sub-pixels Sx are aligned in a matrix form (in rows and columns) in the display region Ad. As illustrated in FIG. 4, one pixel Px is formed of sub-pixels Sx having different colors from each other.

In the specification of the present application, note that the term "row" means a pixel row including a plurality of sub-pixels Sx aligned in the X-axis direction which is the first direction. The term "column" means a pixel column including a plurality of sub-pixels Sx aligned in the Y-axis direction which is the second direction intersecting or preferably orthogonal to the direction in which the rows are aligned.

As illustrated in FIG. 3, a plurality of scanning lines GL extend in the X-axis direction and are aligned in the Y-axis direction in the display region Ad. A plurality of signal lines SL extend in the Y-axis direction and are aligned in the X-axis direction in the display region Ad. Accordingly, the plurality of signal lines SL intersect the plurality of scanning lines GL in a plan view. As described above, in a plan view, the sub-pixels Sx are arranged at intersections of the plurality of scanning lines GL and the plurality of signal lines SL that intersect each other.

From an outside of the array substrate 2 to the COG 19, a master clock, a horizontal synchronizing signal, and a vertical synchronizing signal are input. The COG 19 generates a vertical start pulse VST and a vertical clock pulse VCK based on the master clock, the horizontal synchronizing signal, and the vertical synchronizing signal input to the COG 19, and then, supplies the vertical start pulse VST and the vertical clock pulse VCK to the gate drivers 12A and 12B.

The gate drivers 12A and 12B sequentially select the sub-pixels Sx for each row by sequentially outputting and supplying scanning signals based on the input vertical start pulse VST and vertical clock pulse VCK to the scanning lines GL. The scanning signals are first signals related to an image, and the scanning lines GL are first signal lines to which the scanning signals are supplied.

To the source driver 13, image signals Vsig for, for example, red, green, and blue are provided. The source driver 13 supplies, for each one pixel or each of a plurality of pixels, pixel signals to the sub-pixels Sx of the row selected by the gate drivers 12A and 12B via the signal lines SL, respectively.

As illustrated in FIG. 4, in a plan view, a transistor Tr formed of a thin-film transistor (TFT) serving as a field-effect transistor is provided at the intersection of each of the plurality of scanning lines GL and each of the plurality of signal lines SL. Accordingly, a plurality of transistors Tr are provided in the display region Ad on the substrate 21, and these transistors Tr are aligned in a matrix form in the X-axis direction and the Y-axis direction. That is, a transistor Tr is provided in each of the plurality of sub-pixels Sx. Furthermore, a pixel electrode 22 is provided in each of the plurality of sub-pixels Sx in addition to the transistor Tr.

The transistor Tr is formed of, for example, a thin-film transistor of an n-channel type MOS (metal Oxide Semiconductor). A gate electrode of the transistor Tr is connected to a scanning line GL. One of the source and drain electrodes of the transistor Tr is connected to a signal line SL or is a signal line SL. The other one of the source and drain electrodes of the transistor Tr is connected to the pixel electrode 22.

As illustrated in FIG. 2, the array substrate 2 has the substrate 21, a common electrode COM, an insulating film IF, and the plurality of pixel electrodes 22. The common electrode COM is provided inside the display region Ad on the upper surface 21a of the substrate 21 in a plan view, for example, so as to be integral with the upper surface 21a of the substrate 21. The insulating film IF is provided on the upper surface 21a of the substrate 21 including a surface of the common electrode COM. In the display region Ad, the plurality of pixel electrodes 22 are provided on the insulating film IF. Accordingly, the insulating film IF electrically insulates the common electrode COM and the pixel electrodes 22 from each other.

As illustrated in FIG. 4, inside the display region Ad, the plurality of pixel electrodes 22 are provided in the plurality of sub-pixels Sx aligned in a matrix form in the X-axis direction and the Y-axis direction in a plan view, respectively. Accordingly, the plurality of pixel electrodes 22 are provided in a matrix form in the X-axis direction and the Y-axis direction.

In the example illustrated in FIG. 2, the common electrode COM is provided between the substrate 21 and the pixel electrodes 22. The common electrode COM is provided so as to overlap each of the plurality of pixel electrodes 22 and is superposed with the scanning lines GL in a plan view. A voltage is applied between each of the plurality of pixel electrodes 22 and the common electrode COM, so that an electric field is formed between each of the plurality of pixel electrodes 22 and the common electrode COM, i.e., in each of the plurality of sub-pixels Sx. In this manner, liquid crystals in the liquid crystal layer 6 are oriented, so that an image is displayed in the display region Ad. At this time, a capacitor Cap is formed between the common electrode COM and each of the pixel electrodes 22, and the capacitor Cap serves as a storage capacitor.

Note that the common electrode COM may be provided closer to the liquid crystal layer 6 than the pixel electrodes 22. The common electrode COM may be provided on the substrate 31. In the example illustrated in FIG. 2, the layout of the common electrode COM and the pixel electrodes 22 is one in an FFS (Fringe Field Switching) mode which is a horizontal electric field mode in which the common electrode COM and the pixel electrodes 22 overlap each other in a plan view. However, the layout of the common electrode COM and the pixel electrodes 22 may be one in an IPS (In Plane Switching) mode which is a horizontal electric field mode in which the common electrode COM and the pixel electrodes 22 do not overlap each other in a plan view. Alternatively, the layout of the common electrode COM and the pixel electrodes 22 may be one in a TN (Twisted Nematic) mode or a VA (Vertical Alignment) mode which is a vertical electric field mode.

The liquid crystal layer 6 modulates light that passes therethrough in accordance with the state of the electric field, and, for example, a liquid crystal layer in accordance with the horizontal electric field mode such as the FFS mode or the IPS mode described above is used. Note that an orientation film may be provided between the liquid crystal layer 6 and the array substrate 2 and between the liquid crystal layer 6 and the opposite substrate 3 illustrated in FIG. 2.

As a target of display driving, the gate drivers 12A and 12B sequentially select one row (one horizontal line) of the sub-pixels Sx arranged in a matrix form in the display region Ad by supplying a scanning signal to the gates of the transistors Tr of the sub-pixels Sx via a scanning line GL. The source driver 13 supplies pixel signals to the sub-pixels Sx included in one horizontal line sequentially selected by the gate drivers 12A and 12B via the signal lines SL. The pixel signal is a second signal that is related to an image and is different from the scanning signal, and the signal line SL is a second signal line to which the pixel signal is supplied. In these sub-pixels Sx, display operation for one horizontal line is performed in accordance with the supplied pixel signals.

As illustrated in FIG. 2, the opposite substrate 3 has the substrate 31 and a color filter 32. The color filter 32 is provided on the lower surface of the substrate 31.

As the color filter 32, color filters colored in, for example, three colors of R (red), G (green), and B (blue) are aligned in the X-axis direction. In this manner, as illustrated in FIG. 4, the plurality of sub-pixels Sx corresponding to color regions 32R, 32G, and 32B of three colors of red, green and blue are formed, respectively, and one pixel Px is formed of a plurality of sub-pixels Sx corresponding to a set of color regions 32R, 32G, and 32B, respectively. The sub-pixels Sx of the respective colors of red, green, and blue display the respective colors of red, green, and blue.

The color combination of the color filter 32 may be a combination of a plurality of colors including a color other than red, green, and blue. Furthermore, one pixel Px may include a sub-pixel Sx having no color filter 32 provided therein, i.e., a sub-pixel Sx of W (white) that displays a white color. Alternatively, a color filter may be provided on the array substrate 2 by using a COA (Color filter On Array) technique.

Note that a polarization plate (illustration is omitted) may be provided in a portion lower than the array substrate 2, and a polarization plate (illustration is omitted) may be provided in a portion upper than the opposite substrate 3.

<Configuration of Pixel>

Figure 5:
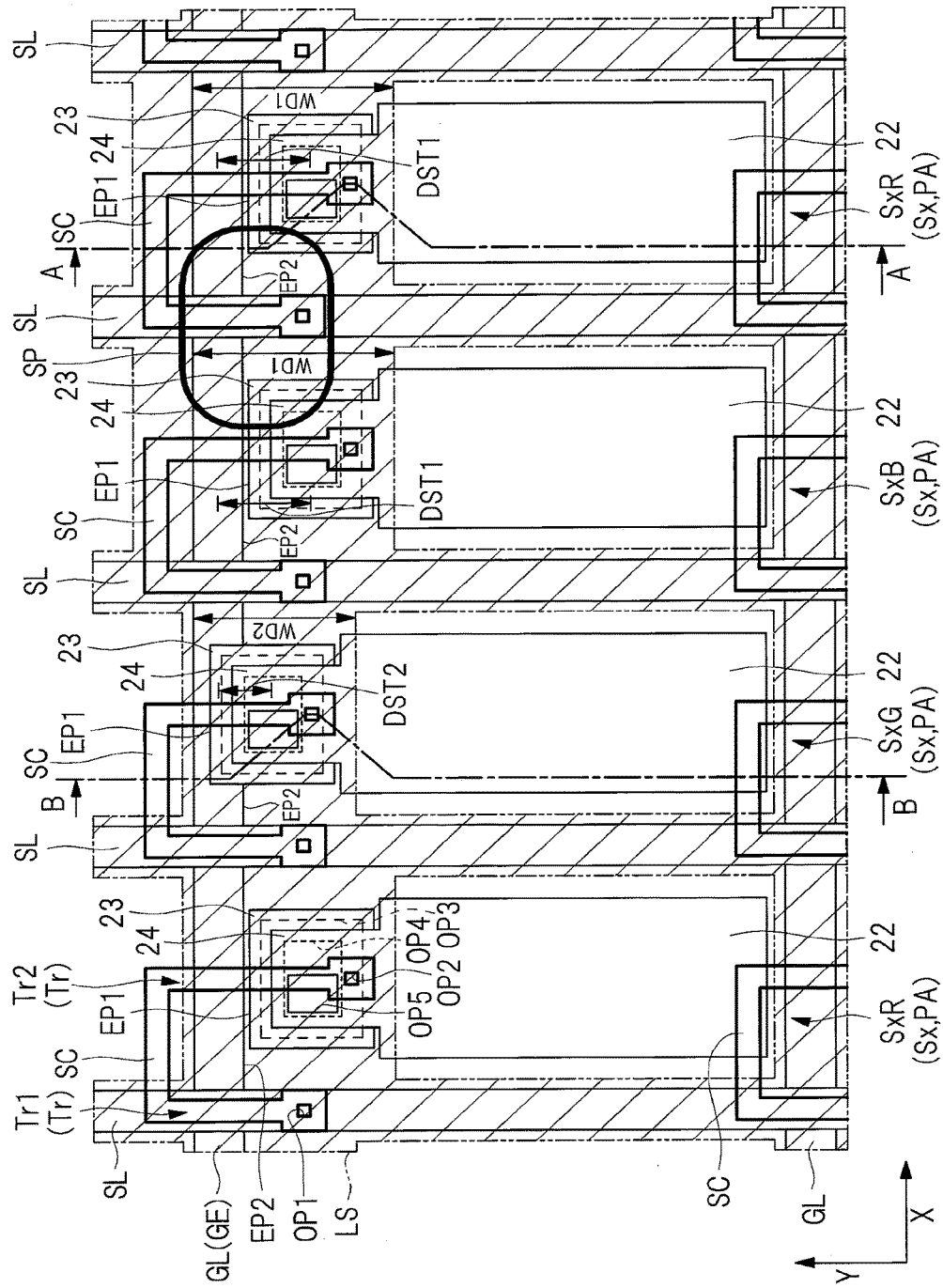
FIG. 5 is a plan view illustrating a configuration of a pixel of the display apparatus according to the first embodiment.
Figure 6:
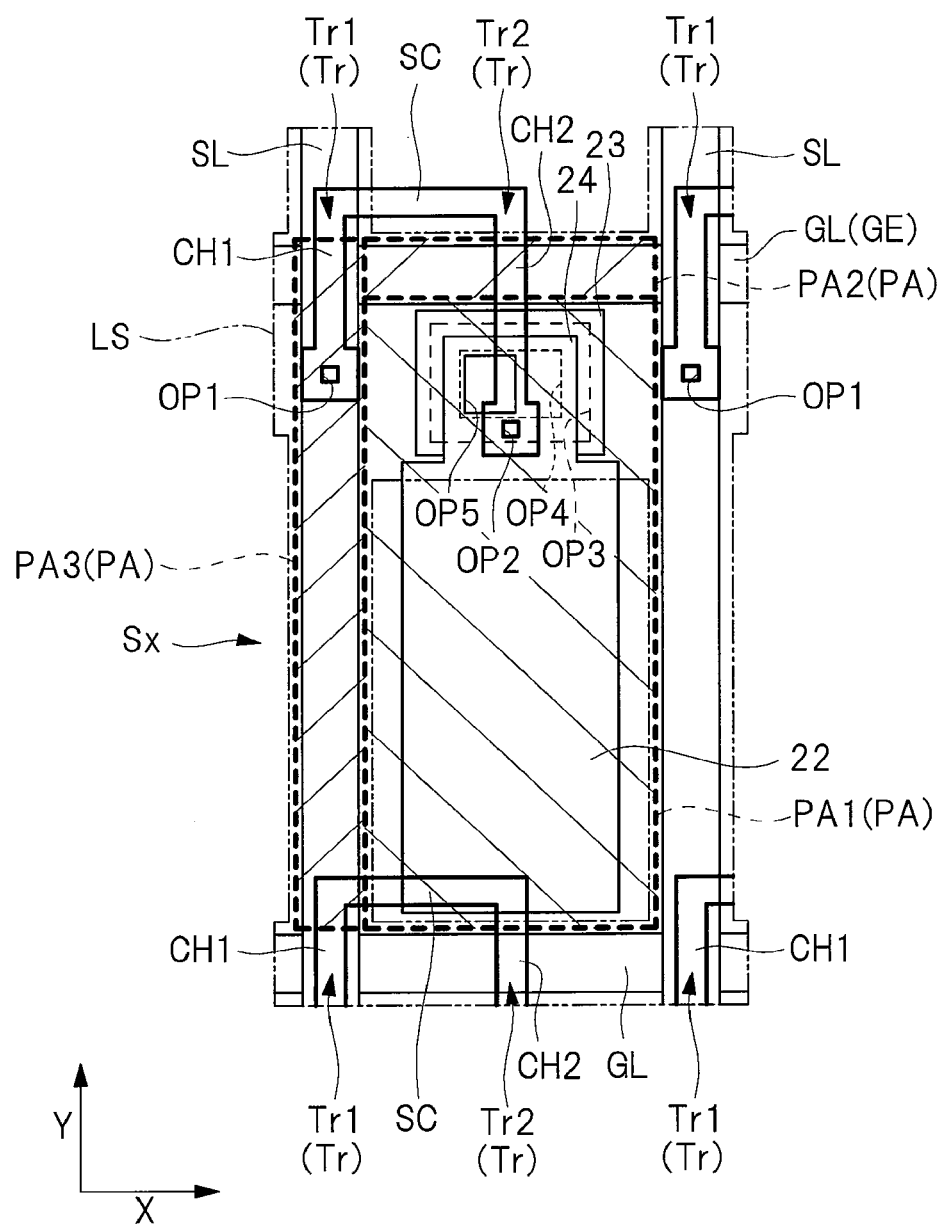
FIG. 6 is a plan view illustrating a configuration of a pixel of the display apparatus according to the first embodiment.
Figure 7:
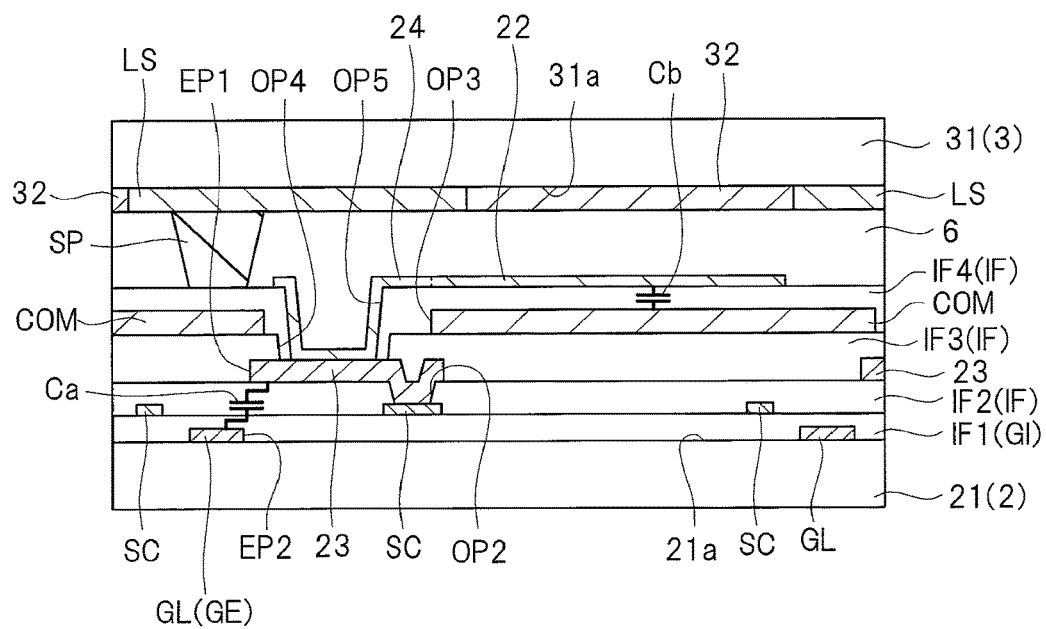
FIG. 7 is a cross-sectional view illustrating a configuration of a pixel of the display apparatus according to the first embodiment.

Next, with reference to FIGS. 5 to 7, a configuration of a pixel will be described in detail. FIGS. 5 and 6 are plan views each illustrating a configuration of a pixel of the display apparatus according to the first embodiment. FIG. 7 is a cross-sectional view illustrating a configuration of a pixel of the display apparatus according to the first embodiment. FIG. 6 illustrates a configuration of one sub-pixel Sx of four sub-pixels Sx illustrated in FIG. 5 in detail. FIG. 7 is a cross-sectional view taken along a line A-A in FIG. 5.

As described above, each pixel Px includes three sub-pixels Sx for displaying three respective colors of red, green, and blue. Alternatively, as described above, each pixel Px may include four sub-pixels Sx for displaying four respective colors of red, green, blue, and white. The sub-pixels Sx of the respective colors are provided on the substrate 21, i.e., the array substrate 2. Note that the layout of the respective electrodes in the sub-pixels Sx will be described later in detail.

As illustrated in FIGS. 5 to 7, each of the plurality of sub-pixels Sx has a pixel region PA, a pixel electrode 22, a pedestal electrode 23, a connection wiring 24, a transistor Tr, and an opening OP2. The transistor Tr includes a scanning line GL serving as a gate electrode GE, an insulating film IF1 serving as a gate insulating film GI, a semiconductor layer SC, a signal line SL serving as one of source and drain electrodes, and the pedestal electrode 23 serving as the other of the source and drain electrodes.

In the example illustrated in FIG. 5, each of a sub-pixel SxR which is a red sub-pixel Sx and a sub-pixel SxB which is a blue sub-pixel Sx is a first pixel. Each of the red sub-pixel SxR and the blue sub-pixel SxB has the pixel region PA serving as a first pixel region, the pixel electrode 22 serving as a first pixel electrode, the pedestal electrode 23 serving as a first conductive electrode, the connection wiring 24 serving as a first conductive wiring, the transistor Tr serving as a first transistor, and the opening OP2 serving as a first opening.

In the example illustrated in FIG. 5, a sub-pixel SxG which is a green sub-pixel Sx is a second pixel. The green sub-pixel SxG has the pixel region PA serving as a second pixel region, the pixel electrode 22 serving as a second pixel electrode, the pedestal electrode 23 serving as a second conductive electrode, the connection wiring 24 serving as a second conductive wiring, the transistor Tr (see FIG. 6) serving as a second transistor, and the opening OP2 (see FIG. 6) serving as a second opening.

Although illustration is omitted in FIG. 5, when a white sub-pixel Sx is provided in addition to the red, green, and blue sub-pixels Sx, note that the white sub-pixel Sx can be similar to the red sub-pixel SxR and the blue sub-pixel SxB except for a different color filter. That is, the white sub-pixel Sx is the first pixel as similar to the red sub-pixel SxR and the blue sub-pixel SxB. Note that the color filter of the white sub-pixel may be not provided or may be a white or transparent color filter.

FIG. 5 illustrates the red sub-pixel SxR and the blue sub-pixel SxB that are aligned in the X-axis direction. The green sub-pixel SxG is adjacent to the blue sub-pixel SxB arranged at an end of the layout of the red sub-pixel SxR and the blue sub-pixel SxB. A signal line SL is interposed between the red sub-pixel SxR and blue sub-pixel SxB that are adjacent to each other. A signal line SL is interposed between the blue sub-pixel SxB adjacent to the green sub-pixel SxG and the red sub-pixel SxR.

As illustrated in FIG. 6, note that it is assumed that the pixel region PA included in a sub-pixel Sx includes a region PA1, a region PA2, and a region PA3 in the specification of the present application. The region PA1 is a region defined by two adjacent scanning lines GL and two adjacent signal lines SL. The region PA2 is a region in which the scanning line GL for driving the transistor Tr for displaying an image in the region PA1 is arranged and is a region adjacent to the region PA1. The region PA3 is a region in which the signal line SL connected to the semiconductor layer SC included in the transistor Tr for displaying an image in the region PA1 is arranged and is a region adjacent to the regions PA1 and PA2.

Therefore, in the specification of the present application, the term "the scanning line GL side of the pixel region PA" means a portion of the region PA1 included in the pixel region PA, the portion being adjacent to the scanning line GL for driving the transistor Tr for displaying an image in the region PA1, and means the region PA2 of the pixel region PA. Furthermore, the term "the signal line SL side of the pixel region PA" means a portion of the region PA1 included in the pixel region PA, the portion being adjacent to the signal line SL for driving the transistor Tr for displaying an image in the region PA1, and means the region PA3 of the pixel region PA.

In each sub-pixel Sx, the transistor Tr is provided in the pixel region PA and is driven by the scanning line GL and the signal line SL. In each sub-pixel Sx, the pixel electrode 22 is provided in the pixel region PA. In each sub-pixel Sx, the connection wiring 24 electrically connects the transistor Tr and the pixel electrode 22. In each sub-pixel Sx, the pedestal electrode 23 is provided between the connection wiring 24 and the transistor Tr. The insulating film IF is provided between the pixel electrode 22 in each sub-pixel Sx and the transistor Tr in the sub-pixel Sx.

As illustrated in FIG. 7, the array substrate 2 includes the substrate 21. The scanning line GL is provided on the upper surface 21a of the substrate 21. The scanning line GL is a first signal line that supplies a scanning signal for driving the transistor Tr (see FIG. 6) to each sub-pixel Sx. The scanning line GL is made of a metal such as molybdenum (Mo) or aluminum (Al).

The insulating film IF1 is provided on the upper surface 21a of the substrate 21 so as to cover the scanning line GL. The insulating film IF1 is made of an inorganic-based insulating material such as silicon nitride (SiN) or silicon oxide ($SiO_2$) and is an insulating film serving as a gate insulating film GI.

The semiconductor layer SC is provided on the insulating film IF1. The semiconductor layer SC is made of, for example, low-temperature polysilicon or amorphous silicon. Alternatively, a transparent oxide semiconductor represented by a zinc-based oxide such as IZO (Indium Zinc Oxide) or IGZO (Indium Gallium Zinc Oxide) may be used.

An insulating film IF2 is provided on the insulating film IF1 so as to cover the semiconductor layer SC. The insulating film IF2 is made of an inorganic-based insulating material such as silicon nitride (SiN) or silicon oxide ($SiO_2$) as similar to the insulating film IF1.

As illustrated in FIGS. 5 to 7, in the insulating film IF2, the opening OP1 and the opening OP2 that pass therethrough and reach the semiconductor layer SC are provided. Note that illustration of the opening OP1 is omitted in FIG. 7.

The pedestal electrode 23 is provided in the opening OP2 and on the insulating film IF2, and the pedestal electrode 23 is electrically connected to the semiconductor layer SC via the opening OP2. The pedestal electrode 23 is made of a metal such as aluminum (Al).

Although not illustrated in FIG. 7, note that the signal line SL ( ) is provided in the opening OP1 and on the insulating film IF2 as similar to the pedestal electrode 23 provided in the opening OP2 and on the insulating film IF2, and that the signal line SL is electrically connected to the semiconductor layer SC via the opening OP1. The signal line SL is a second signal line that supplies a pixel signal for displaying an image to each pixel. The signal line SL is made of a metal such as aluminum (Al).

As described above, the semiconductor layer SC, the signal line SL, and the scanning line GL are provided in different layers in a direction perpendicular to the upper surface 21a of the substrate 21. The signal line SL and the pedestal electrode 23 are provided in the same layer in the direction perpendicular to the upper surface 21a of the substrate 21.

The scanning line GL sterically crosses a part of the semiconductor layer SC, and the scanning line GL functions as the gate electrode GE of the transistor Tr. In the present first embodiment, two separate portions of the semiconductor layer SC sterically crosses the scanning line GL, and the transistor Tr is a double gate transistor that includes a channel CH1 which is an n channel and a channel CH2 which is an n channel. That is, the transistor Tr is formed of a transistor Tr1 including the channel CH1 and a transistor Tr2 including the channel CH2.

Therefore, the channel CH1 and the channel CH2 extend in the Y-axis direction, are spaced away from each other in the X-axis direction, and are connected in series with each other. With the structure, the space between the channel CH1 and the channel CH2 in the transistor Tr can be narrowed. Accordingly, in the present first embodiment, the space between two adjacent signal lines SL can be narrowed, so that a pixel pitch is decreased, and high resolution of the image displayed on the display apparatus can be achieved.

The signal line SL is connected to the semiconductor layer SC via the opening OP1 and functions as, for example, a source electrode of the transistor Tr. The pedestal electrode 23 is connected to the semiconductor layer SC via the opening OP2 and functions as, for example, a drain electrode of the transistor Tr. Alternatively, for example, in a case where the signal line SL functions as the drain electrode of the transistor Tr, the pedestal electrode 23 functions as the source electrode of the transistor Tr.

In the example illustrated in FIG. 7, the semiconductor layer SC is arranged between the scanning line GL and the signal line SL (illustration is omitted) which is provided in the same layer as the pedestal electrode 23 in the direction perpendicular to the upper surface 21a of the substrate 21, and the transistor Tr has a bottom gate structure. However, the direction perpendicular to the upper surface 21a of the substrate 21, the scanning line GL may be arranged between the semiconductor layer SC and the signal line SL (illustration is omitted) which is provided in the same layer as the pedestal electrode 23, and the transistor Tr may have a top gate structure.

On the insulating film IF2, an insulating film IF3 is provided so as to cover the signal line SL and the pedestal electrode 23. The insulating film IF3 is made of an organic-based insulating material such as an acrylic resin.

On the insulating film IF3, the common electrode COM is provided. The common electrode COM is a transparent electrode made of a transparent conductive material such as ITO (Indium Tin Oxide), i.e., a transparent conductive oxide.

In a portion of the common electrode COM located above the pedestal electrode 23, an opening OP3 that passes through the common electrode COM and reaches the insulating film IF3 is provided. In a portion of the insulating film IF3 exposed from the opening OP3, an opening OP4 that passes through the insulating film IF3 and reaches the pedestal electrode 23 is provided.

In the opening OP4 and on the insulating film IF3, an insulating film IF4 is provided so as to cover the common electrode COM. The insulating film IF4 is made of an inorganic-based insulating material such as silicon nitride (SiN) or silicon oxide ($SiO_2$) as similar to the insulating film IF1. The insulating film IF illustrated in FIG. 2 is formed of the insulating films IF1, IF2, IF3, and IF4.

In a portion of the insulating film IF4 located in the opening OP4, an opening OP5 that passes through the insulating film IF4 and reaches the portion of the pedestal electrode 23 located in the opening OP4 is provided. In the opening OP5 and on the insulating film IF4, the connection wiring 24 and the pixel electrode 22 are provided. The connection wiring 24 and the pixel electrode 22 are transparent electrodes made of a transparent conductive material such as ITO. The connection wiring 24 and the pixel electrode 22 are provided integrally with each other. Accordingly, the connection wiring 24 and the pixel electrode 22 are electrically connected to each other.

The connection wiring 24 is electrically connected to the pedestal electrode 23 via the opening OP5. That is, in each sub-pixel Sx, the connection wiring 24 and the pedestal electrode 23 are provided in the opening OP5 in a plan view.

Note that the opening OP5 provided in the insulating film IF4 in the red sub-pixel SxR and the blue sub-pixel SxB is a first opening, and the opening OP5 provided in the insulating film IF4 in the green sub-pixel SxG is a second opening.

The insulating film IF4 is provided so as to cover the common electrode COM, and the pixel electrode 22 is provided on the insulating film IF4. With the structure, the common electrode COM is provided between the substrate 21 and the pixel electrode 22.

On the insulating film IF4, an orientation film (illustration is omitted) made of, for example, polyimide is stacked (provided) so as to cover the pixel electrode 22. This orientation film is subjected to a rubbing process in a certain direction.

As illustrated in FIG. 7, the opposite substrate 3 includes the substrate 31. The color filter 32 is provided on the lower surface 31a which is one main surface of the substrate 31. The color filter 32 includes color regions colored in, for example, three colors of red, green, and blue.

On the lower surface 31a of the substrate 31, a light shielding film LS is provided. The light shielding film LS is made of, for example, a resin or a metal, has a light shielding property, and is also referred to as a black matrix. The light shielding film LS is provided so as to face the scanning line GL and the signal line SL. The light shielding film LS is superposed with the scanning line GL, the signal line SL, the connection wiring 24, and the pedestal electrode 23 in each sub-pixel Sx in a plan view. Meanwhile, a proportion occupied by an area of a portion of the sub-pixel Sx not covered with the light shielding film LS corresponds to an aperture ratio. Note that the shape of the light shielding film LS is not limited to a matrix form.

In order to prevent reflection from the scanning line GL, the signal line SL, and the pedestal electrode 23 that are made of a metal, the light shielding film LS is provided so as to embed the scanning line GL, the signal line SL, and the pedestal electrode 23 therein. That is, the light shielding film LS is provided so that the scanning line GL, the signal line SL, and the pedestal electrode 23 are arranged inside a region in which the light shielding film LS is arranged.

If the width of the light shielding film LS is too small, the light shielding film LS cannot completely shield light from the scanning line GL, the signal line SL, and the pedestal electrode 23, and the light shielding film LS cannot prevent reflection from the scanning line GL, the signal line SL, and the pedestal electrode 23. Also, if the width of the light shielding film LS is too large, the aperture ratio is decreased, and the luminance of a displayed image is decreased. Therefore, the aperture ratio is maximized by arranging the light shielding film LS having a minimum width required to prevent the reflection from the scanning line GL, the signal line SL, and the pedestal electrode 23 in consideration of a margin for planar shape accuracy of the scanning line GL, the signal line SL, the pedestal electrode 23, and the light shielding film LS in a manufacturing process.

Generally, human eyes are easy to recognize the luminance of a green color region more than the luminance of a red color region and a blue color region. Therefore, in order to improve the luminance of the entire displayed image and to optimize white balance, the width of the light shielding film LS is made larger in the red sub-pixel SxR and the blue sub-pixel SxB than the green sub-pixel SxG so that the aperture ratio is made lower. Accordingly, as described later, the superposed width of the light shielding film LS with the red pixel region PA in the Y-axis direction is larger than the superposed width of the light shielding film LS with the green pixel region PA in the Y-axis direction, and the superposed width of the light shielding film LS with the blue pixel region PA in the Y-axis direction is larger than the superposed width of the light shielding film LS with the green pixel region PA in the Y-axis direction.

Note that there is a tendency that blue among red, green, and blue is most difficult to be recognized by human eyes, and therefore, the blue sub-pixel SxB may be the second pixel.

As illustrated in FIGS. 5 and 7, a spacer SP is provided on the lower surface 31a of the substrate 31 so as to cover the light shielding film LS and the color filter 32.

The spacer SP is provided between the substrate 21 and the substrate 31, i.e., between the array substrate 2 and the opposite substrate 3, and is provided on one of the substrates so as to keep a distance between the substrate 21 and the substrate 31, i.e., a distance between the array substrate 2 and the opposite substrate 3, so that a certain thickness of the liquid crystal layer 6 is kept. The spacer SP is made of a transparent resin material such as a photoresist. On the lower surface 31a of the substrate 31, an orientation film (illustration is omitted) made of, for example, polyimide is provided so as to cover the light shielding film LS, the color filter 32, and the spacer SP.

The array substrate 2 and the opposite substrate 3, i.e., the substrate 21 and the substrate 31 are arranged so as to face each other through the spacer SP, that is, they are oppositely arranged. Furthermore, although not illustrated, a seal member is provided between an outer peripheral portion of the array substrate 2 and an outer peripheral portion of the opposite substrate 3. A space between the array substrate 2 and the opposite substrate 3 that oppositely face each other is filled with the liquid crystal layer 6.

The spacer SP may be not provided in all of the sub-pixels Sx. For example, one spacer SP may be provided for six sub-pixels Sx aligned in the X-axis direction in which the scanning lines GL extend.

In the example illustrated in FIG. 5, the spacer SP overlaps the blue sub-pixel SxB and the red sub-pixel SxR adjacent to the blue sub-pixel SxB in a plan view. That is, in a plan view, the spacer SP overlaps the signal line SL in a portion between the two adjacent blue sub-pixel SxB and red sub-pixel SxR serving as the first pixel.

The light shielding film LS is provided so as to include the spacer SP therein. That is, the light shielding film LS is provided so that the spacer SP is arranged inside a region in which the light shielding film LS is arranged.

In the liquid crystal layer 6 in a portion located in periphery of the spacer SP, orientation direction of liquid crystal molecules is easier to be uneven than in the liquid crystal layer 6 in a portion located away from the spacer SP, and therefore, has a risk of occurrence of defects in a displayed image. This is because, for example, the spacer SP makes contact with the orientation film (illustration is omitted) provided on the insulating film IF4 so as to cover the pixel electrode 22. Therefore, it is desirable that the width of the spacer SP in a portion located in periphery of the light shielding film LS be larger than the width of the light shielding film LS in a portion located away from the spacer SP.

The spacer SP overlaps the scanning line GL connected to the two transistors Tr included in the two adjacent red sub-pixel SxR and the blue sub-pixel SxB serving as the first pixel in a plan view. The center of the spacer SP in the Y-axis direction is located on the negative side of the scanning line GL in the Y-axis direction. In this manner, the spacer SP can be easily arranged so that the spacer SP is arranged inside the region in which the light shielding film LS is arranged.

The liquid crystal layer 6 modulates light that passes therethrough in accordance with the state of an electric field. As the liquid crystal layer 6, liquid crystals supporting for a horizontal electric field mode such as the FFS mode or the IPS mode are used. Alternatively, as the liquid crystal layer 6, liquid crystals supporting for various modes such as the TN mode, VA mode, or ECB (Electrically Controlled Birefringence) mode may be used.

By such a configuration, an electric field occurs between the common electrode COM and the pixel electrode 22 in each sub-pixel Sx when the transistor Tr is turned ON, and the orientation of the liquid crystal molecules in the liquid crystal layer 6 changes. In this manner, light transmittance of the liquid crystal layer 6 is changed so as to display an image in the FFS mode. Furthermore, a region in which the common electrode COM and the pixel electrode 22 face each other across the insulating film IF4 from each other forms an auxiliary capacitor, and holds the electric field between the common electrode COM and the pixel electrode 22 for a predetermined time when the transistor Tr is turned OFF.

<Overlap Between Pedestal Electrode and Scanning Line in Plan View>

Here, with reference to FIGS. 5 and 7, overlap between the pedestal electrode 23 and the scanning line GL in a plan view will be described.

In the sub-pixel SxR which is a red sub-pixel Sx, the pedestal electrode 23 is adjacent to the scanning line GL that drives the transistor Tr on the negative side (first side) of the scanning line GL in the Y-axis direction (second direction) in a plan view. That is, in the sub-pixel SxR, the center of the pedestal electrode 23 in the Y-axis direction is arranged closer to the negative side of the scanning line GL that drives the transistor Tr in the Y-axis direction than the center thereof in the Y-axis direction.

The structure of the pedestal electrode 23 is similar in the sub-pixel SxG which is a green sub-pixel Sx and the sub-pixel SxB which is a blue sub-pixel Sx.

In the present first embodiment, a distance DST1 in the Y-axis direction between the pedestal electrode 23 and the scanning line GL that drives the transistor Tr in a plan view in the red sub-pixel SxR and the blue sub-pixel SxB is longer than a distance DST2 in the Y-axis direction between the pedestal electrode 23 and the scanning line GL that drives the transistor Tr in a plan view in the green sub-pixel SxG. Furthermore, a superposed width WD1 of the light shielding film LS with the red pixel region PA and the blue pixel region PA in the Y-axis direction is larger than a superposed width WD2 of the light shielding film LS with the green pixel region PA in the Y-axis direction.

In this manner, even when the width of the light shielding film LS is made larger so as to decrease the aperture ratio in the red sub-pixel SxR and the blue sub-pixel SxB than the green sub-pixel SxG in order to improve the luminance of an image and to optimize the white balance, the capacitance between the scanning line GL and the common electrode COM can be decreased in the sub-pixel SxR and the sub-pixel SxB.

In the specification of the present application, note that the term "distance in the Y-axis direction between the pedestal electrode 23 and the scanning line GL in a plan view in each sub-pixel Sx" means, for example, a distance in the Y-axis direction between the center of the pedestal electrode 23 and the center of the scanning line GL.

Also, In the specification of the present application, the term "superposed width of the light shielding film LS with a pixel region PA in the Y-axis direction in each sub-pixel Sx" means a distance in the Y-axis direction between a positive-side side end portion in the Y-axis direction of the scanning line GL provided in the region PA2 (see FIG. 6) and a positive-side side end portion in the Y-axis direction of an opening provided in the light shielding film LS in the region PA1 (see FIG. 6).

In the example illustrated in FIG. 5, in the red sub-pixel SxR and the blue sub-pixel SxB, a positive-side side end portion EP1 in the Y-axis direction of the pedestal electrode 23 is arranged closer to the negative side in the Y-axis direction than a negative-side side end portion EP2 in the Y-axis direction of the scanning line GL. That is, in the sub-pixel SxR and the sub-pixel SxB, the pedestal electrode 23 does not overlap the scanning line GL and is away from the scanning line GL in a plan view.

In such a case, the effect of decreasing the capacitance between the scanning line GL and the common electrode COM can be enhanced in the red sub-pixel SxR and the blue sub-pixel SxB.

A case that the length of the spacer SP in the X-axis direction is shorter than the length of the spacer SP in the Y-axis direction, i.e., a case that the spacer SP has a longitudinally long shape in a plan view. In such a case, although the spacer SP is covered with a portion of the light shielding film LS provided so as to include the signal line SL, it is difficult to arrange the spacer SP inside a region in which the portion of the light shielding film LS provided so as to include the signal line SL in is provided. Accordingly, it is preferable that the length of the spacer SP in the X-axis direction be longer than the length of the spacer SP in the Y-axis direction, and the spacer SP have a laterally long shape in a plan view.

In such a case, the spacer SP overlaps the signal line SL in a portion interposed between two adjacent sub-pixels Sx in a plan view. Furthermore, in the sub-pixel Sx that overlaps the spacer SP in a plan view, the width in the Y-axis direction of the light shielding film LS that overlaps a portion of the pixel region PA which is adjacent to the scanning line GL in is increased, and therefore, it is easy to arrange the pedestal electrode 23 on the scanning line GL side of the pixel region PA, i.e., on the negative side in the Y-axis direction thereof.

In the example illustrated in FIG. 5, in the green sub-pixel SxG, the positive-side side end portion EP1 in the Y-axis direction of the pedestal electrode 23 is arranged closer to the positive side in the Y-axis direction than the negative-side side end portion EP2 in the Y-axis direction of the scanning line GL as different from the red sub-pixel SxR. That is, in the sub-pixel SxG, the pedestal electrode 23 overlaps the scanning line GL in a plan view.

Note that, also in the green sub-pixel SxG, the positive-side side end portion EP1 in the Y-axis direction of the pedestal electrode 23 may be arranged closer to the negative side in the Y-axis direction than the negative-side side end portion EP2 in the Y-axis direction of the scanning line GL as similar to the red sub-pixel SxR. That is, the pedestal electrode 23 may not overlap the scanning line GL in a plan view.

<Load Related to Scanning Line and Common Electrode>

Next, a load related to the scanning line GL and the common electrode COM will be described in comparison with a display apparatus according to a first comparative example. In the display apparatus according to the first comparative example, the layout of the pedestal electrode 23 and the connection wiring 24 is different from the layout of the pedestal electrode 23 and the connection wiring 24 in the display apparatus according to the first embodiment.

Figure 8:
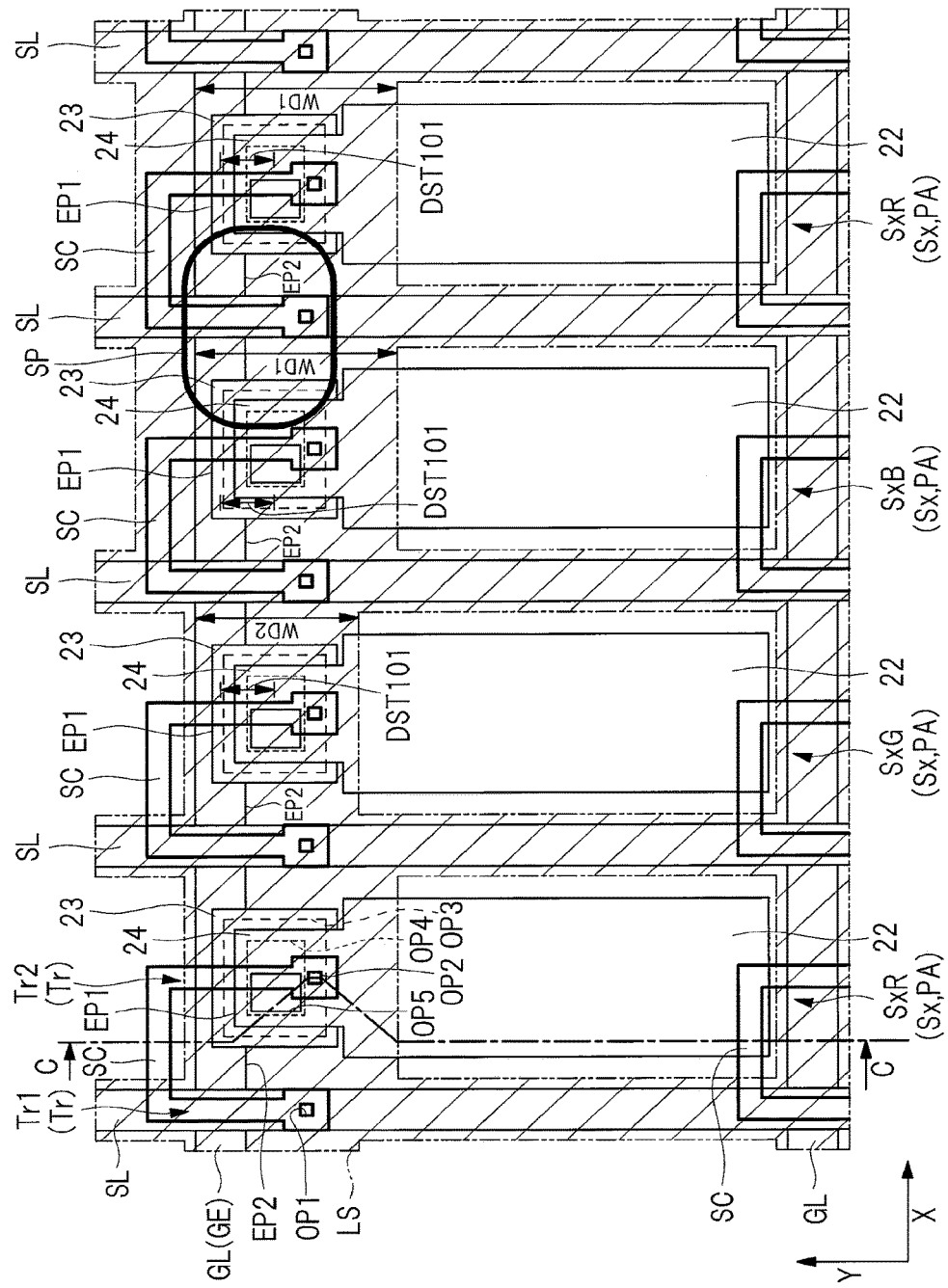
FIG. 8 is a plan view illustrating a configuration of a pixel of a display apparatus according to a first modification example.
Figure 9:
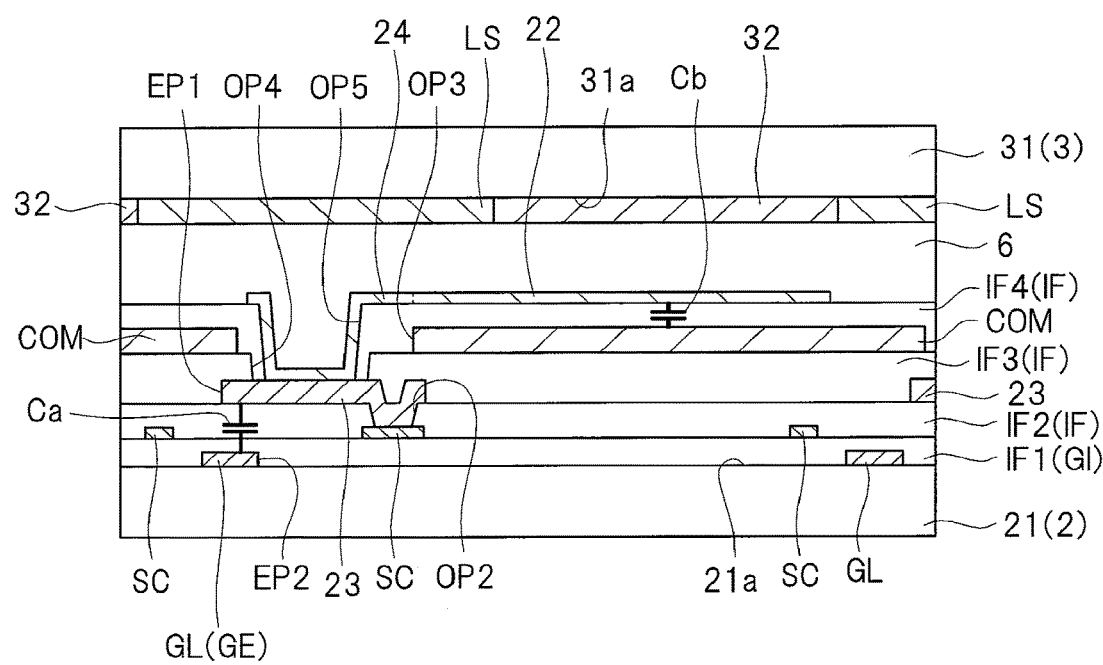
FIG. 9 is a cross-sectional view illustrating a configuration of a pixel of the display apparatus according to the first modification example.

FIG. 8 is a plan view illustrating a configuration of a pixel of the display apparatus according to the first comparative example. FIG. 9 is a cross-sectional view illustrating a configuration of a pixel of the display apparatus according to the first comparative example. FIG. 9 is a cross-sectional view taken along a line C-C in FIG. 8. Note that a cross-sectional view taken along a line B-B in FIG. 5 is similar to the cross-sectional view of FIG. 9 except for the layout of the light shielding film LS.

In the display apparatus according to the first comparative example, the pedestal electrode 23 and the scanning line GL overlap each other in a plan view in all of the color sub-pixels Sx for red, green, and blue.

Also in the display apparatus according to the first comparative example, the pedestal electrode 23 is adjacent to the scanning line GL that drives the transistor Tr on the negative side of the scanning line GL in the Y-axis direction in a plan view in all of the color sub-pixels Sx for red, green, and blue as similar to the display apparatus according to the first embodiment. That is, the center of the pedestal electrode 23 in the Y-axis direction is arranged closer to the negative side in the Y-axis direction than the center in the Y-axis direction of the scanning line GL that drives the transistor Tr.

Also in the display apparatus according to the first comparative example, the superposed width WD1 of the light shielding film LS with the red and blue pixel regions PA in the Y-axis direction is larger than the superposed width WD2 of the light shielding film LS with the green pixel region PA in the Y-axis direction as similar to the display apparatus according to the first embodiment. This manner is for improving the luminance of an image and for optimizing the white balance, and besides, for thickening the light shielding film LS in the red sub-pixel SxR and the blue sub-pixel SxB more than the green sub-pixel SxG so as to decrease the aperture ratio.

On the other hand, in the display apparatus according to the first comparative example, all of the color sub-pixels Sx for red, green, and blue are equal to each other in a distance DST101 in the Y-axis direction between the pedestal electrode 23 and the scanning line GL that drives the transistor Tr as different from the display apparatus according to the first embodiment.

In other words, the superposed width WD2 of the light shielding film LS with the green pixel region PA in the Y-axis direction is smaller than the superposed width WD1 of the light shielding film LS with the red pixel region PA in the Y-axis direction as described above. Accordingly, the side end portion EP1 of the pedestal electrode 23 in the red sub-pixel SxR and the blue sub-pixel SxB is not arranged closer to the negative side in the Y-axis direction than the side end portion EP1 of the pedestal electrode 23 in the green sub-pixel SxG.

Therefore, when all of the color sub-pixels Sx are equal to each other in the distance DST101 in the Y-axis direction between the pedestal electrode 23 and the scanning line GL, there is a risk that the side end portion EP1 of the pedestal electrode 23 is arranged closer to the positive side in the Y-axis direction than the side end portion EP2 of the scanning line GL in all of the color sub-pixels Sx. That is, there is a risk that the pedestal electrode 23 widely overlaps the scanning line GL in a plan view, which results in increase in the parasitic capacitance of the scanning line GL in all of the color sub-pixels Sx for red, green, and blue.

Figure 10:
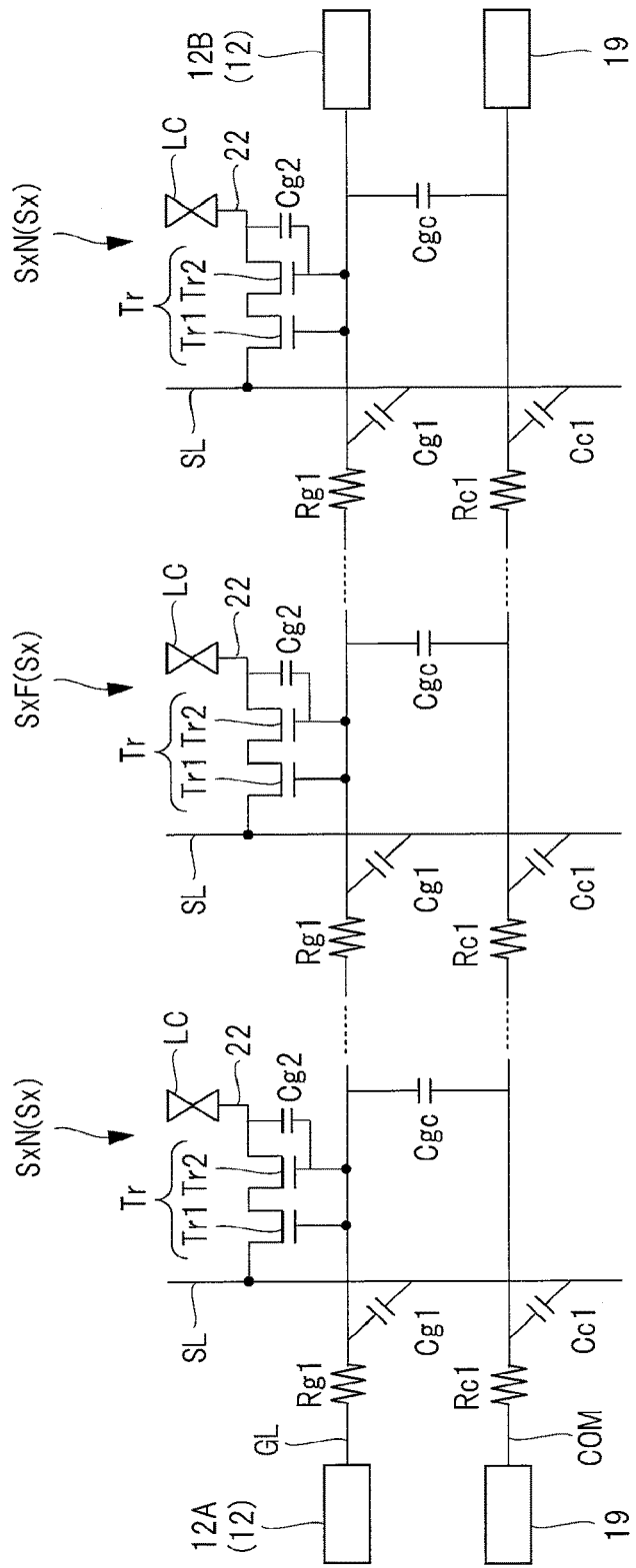
FIG. 10 is a circuit diagram partially illustrating an equivalent circuit of the display apparatus according to the first modification example.

FIG. 10 is a circuit diagram illustrating a part of an equivalent circuit of the display apparatus according to the first comparative example. FIG. 10 illustrates one scanning line GL, a plurality of signal lines SL that intersect the one scanning line GL, a plurality of transistors Tr provided at respective intersections between the plurality of signal lines and the one scanning line GL, and the sub-pixels Sx having the plurality of respective transistors Tr.

As illustrated in FIG. 10, it is assumed that a capacitor between the scanning line GL and each of the signal lines SL is a capacitor Cg1, that a capacitor between the scanning line GL, i.e., a gate electrode of each of the transistors Tr and each of the pixel electrodes 22 is a capacitor Cg2, and that a resistor serving as a wiring resistor of the scanning line GL is a resistor Rg1. Furthermore, it is assumed that a capacitor between the common electrode COM and each of the signal lines SL is a capacitor Cc1, that a capacitor between the scanning line GL, i.e., agate electrode of each of the transistors Tr and the common electrode COM is a capacitor Cgc, and that a resistor serving as a wiring resistor of the common electrode COM is a resistor Rc1.

Furthermore, it is assumed that a sub-pixel Sx located close to either one of the gate drivers 12A and 12B among the sub-pixels Sx is a sub-pixel SxN. On the other hand, it is assumed that a sub-pixel Sx located far from both of the gate drivers 12A and 12B among the sub-pixels Sx is a sub-pixel SxF. At this time, the common electrode COM in the sub-pixel SxF is farther from the COG 19 than the common electrode COM in the sub-pixel SxN.

Figure 11:
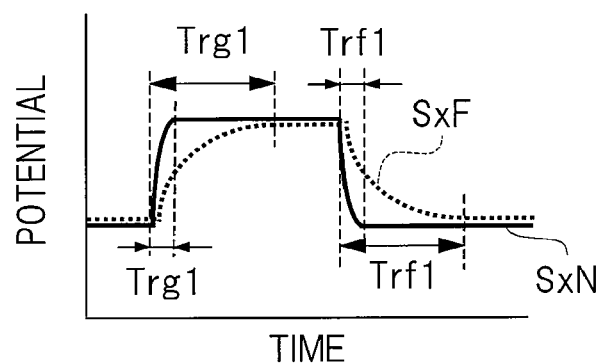
FIG. 11 is a graph schematically illustrating time variation of an electric potential of agate electrode obtained when a scanning signal is supplied to a scanning line.
Figure 12:
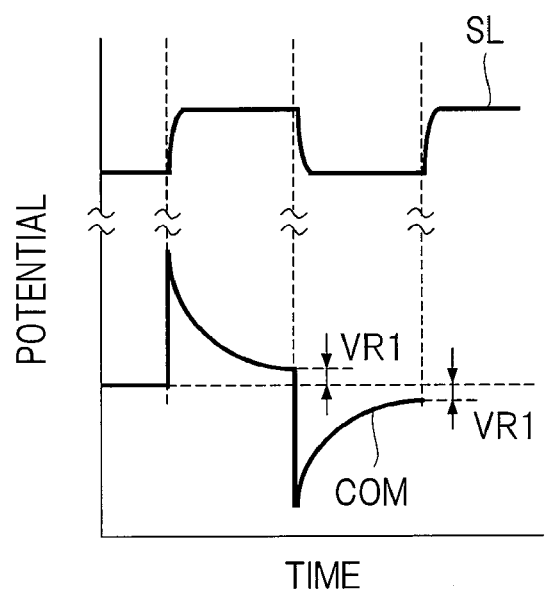
FIG. 12 is a graph schematically illustrating time variation of an electric potential of a signal line and a common electrode obtained when a signal is supplied to a signal line.

FIG. 11 is a graph schematically illustrating time change of the electric potential of a gate electrode obtained when a scanning signal is supplied to a scanning line. FIG. 12 is a graph schematically illustrating time change of the electric potentials of a signal line and a common electrode obtained when a signal is supplied to the signal line.

when the electric potential of a scanning signal supplied from the gate driver 12A or 12B (see FIG. 10) to the scanning line GL rises or drops, the electric potential of a gate electrode of each sub-pixel Sx rises or drops as illustrated in FIG. 11. When the capacitor Cg1, the capacitor Cg2, the capacitor Cgc, or the resistor Rg1 illustrated in FIG. 10 increases, a parasitic capacitance or a wiring resistance related to the scanning line GL increases, and therefore, a period Trg1 for which the rise of the electric potential of the gate electrode in each sub-pixel Sx is delayed when the electric potential of the scanning signal supplied to the scanning line GL rises. Alternatively, a period Trf1 for which the drop of the electric potential of the gate electrode in each sub-pixel Sx is delayed when the electric potential of the scanning signal supplied to the scanning line GL drops.

The period Trg1 in the sub-pixel SxF is longer than the period Trg1 in the sub-pixel SxN, and the period Trf1 in the sub-pixel SxF is longer than the period Trf1 in the sub-pixel SxN. That is, the parasitic capacitance or wiring resistance related to the scanning line GL is easier to increase in a sub-pixel Sx farther from both of the gate drivers 12A and 12B. Accordingly, a timing at which a signal is supplied to the gate electrode of the transistor Tr via the scanning line GL is later than a desired timing, or an intensity of a signal supplied to the gate electrode of the transistor Tr via the scanning line GL is smaller than a desired signal intensity. That is, in a sub-pixel Sx farther from both of the gate drivers 12A and 12B, the load related to the scanning line GL is larger, and therefore, the electric potential of the signal supplied to the gate electrode of the transistor Tr via the scanning line GL is easier to change from a desired electric potential.

Although the high resolution of the pixel and the large size of the display region in a display apparatus are proposed, it is desirable that a frame frequency at which an image is displayed again on a display region for each unit time be constant regardless of the high resolution of the pixel and the large size of the display region. Therefore, a period for which an image is displayed in a plurality of sub-pixels Sx including the respective transistors Tr driven by one horizontal line, i.e., one scanning line GL is shortened in accordance with the high resolution of the pixel and the large size of the display region, and the influence of load such as the parasitic capacitance or the wiring resistance related to the scanning line GL becomes remarkable.

That is, in accordance with the high resolution of the pixel and the large size of the display region, the tendency of the increase in the load related to the scanning line GL and the tendency of the easy change of the electric potential of a signal supplied to the gate electrode of the transistor Tr via the scanning line GL from a desired electric potential become more remarkable in a sub-pixel Sx farther from the gate drivers 12A and 12B. Therefore, the high resolution of the pixel or the large size of the display region cannot be easily achieved.

Meanwhile, as illustrated in FIG. 12, when a signal supplied to the signal line SL, i.e., the electric potential of the signal line SL rises or drops, the electric potential of the common electrode COM coupled with the signal line SL via the capacitor Cc1 changes in accordance with the change of the electric potential of the signal line SL.

When the capacitor Cc1, the capacitor Cgc, or the resistor Rc1 illustrated in FIG. 10 increases, the parasitic capacitance or wiring resistance related to the common electrode COM increases. When the electric potential of the signal line SL rises, the electric potential of the common electrode COM changes to rise once, and then, return to an electric potential of the common electrode COM at a moment before the rise of the electric potential of the signal line SL is delayed. That is, at a moment immediately before a subsequent drop of the electric potential of the signal line SL, the electric potential of the common electrode COM is higher by an electric potential VR1 than the electric potential to which the common electrode COM should be returned.

Furthermore, when the electric potential of the signal line SL drops, the electric potential of the common electrode COM changes to drop once, return to an electric potential of the common electrode COM at a moment before the drop of the electric potential of the signal line SL is delayed. That is, at a moment immediately before a subsequent rise of the electric potential of the signal line SL, the electric potential of the common electrode COM is lower by the electric potential VR1 than the electric potential to which the common electrode COM should be returned.

Furthermore, in a pixel farther from a control device such as the COG 19, the parasitic capacitance or the wiring resistance related to the common electrode COM is larger, the load related to the common electrode COM is larger, and the electric potential of the common electrode COM is easier to change due to the influence of a signal supplied to the signal line SL. Therefore, quality of an image displayed by a pixel in a display region is deteriorated.

The load such as the parasitic capacitance or the wiring resistance related to the common electrode COM also increases in accordance with the high resolution of the pixel and the large size of the display region. Accordingly, the phenomenon of the delay of the return from the change of the electric potential of the common electrode COM caused by the change of the electric potential of the signal line SL becomes more remarkable in accordance with the high resolution of the pixel and the large size of the display region.

That is, in accordance with the high resolution of the pixel and the large size of the display region, the tendency of the increase in the load related to the common electrode COM and the tendency of the change of the electric potential of the common electrode COM due to influence of a waveform of a signal supplied to the signal line SL become more remarkable in a pixel farther from the control device such as the COG 19.

Here, as illustrated in FIG. 9, it is assumed that a capacitor between the scanning line GL and the pedestal electrode 23 is a capacitor Ca and that a capacitor between the common electrode COM and the pixel electrode 22 is a capacitor Cb. At this time, the capacitor Cgc between the scanning line GL and the common electrode COM is a capacitor formed by the capacitor Ca and the capacitor Cb that are connected in series, and therefore, is expressed by the following equation (1).

$$Cgc=(Ca \times Cb)/(Ca+Cb) \qquad (1)$$

Therefore, as expressed in the equation (1), the capacitor Cgc increases in accordance with the increase in the capacitor Ca.

In the display apparatus according to the first comparative example, the pedestal electrode 23 and the scanning line GL overlap each other in a plan view in all of the color sub-pixels Sx for red, green, and blue. Therefore, the capacitor Ca increases, and the capacitor Cgc expressed by the equation (1) increases.

Accordingly, the parasitic capacitance or the wiring resistance related to the scanning line GL increases, and the period Trg1 or the period Trf1 illustrated in FIG. 11 tends to be long. Furthermore, the parasitic capacitance or the wiring resistance related to the common electrode COM increases, and the return from the change of the electric potential of the common electrode COM illustrated in FIG. 12 tends to be delayed.

Furthermore, it is desirable that the pedestal electrode 23 be covered with the light shielding film LS. Therefore, there is a risk of decrease in an aperture ratio of each sub-pixel Sx depending on the layout of the pedestal electrode 23.

<Main Feature and Effect of the Present Embodiment>

Meanwhile, in the present first embodiment, a distance in the Y-axis direction between the pedestal electrode 23 and the scanning line GL that drives the transistor Tr in a plan view in the red sub-pixel SxR is longer than a distance in the Y-axis direction between the pedestal electrode 23 and the scanning line GL that drives the transistor Tr in a plan view in the green sub-pixel SxG. Furthermore, the superposed width of the light shielding film LS with the red pixel region PA in the Y-axis direction is larger than the superposed width of the light shielding film LS with the green pixel region PA in the Y-axis direction.

Furthermore, in the present first embodiment, a distance in the Y-axis direction between the pedestal electrode 23 and the scanning line GL that drives the transistor Tr in a plan view in the blue sub-pixel SxB is longer than a distance in the Y-axis direction between the pedestal electrode 23 and the scanning line GL that drives the transistor Tr in a plan view in the green sub-pixel SxG. Furthermore, the superposed width of the light shielding film LS with the blue pixel region PA in the Y-axis direction is larger than the superposed width of the light shielding film LS with the green pixel region PA in the Y-axis direction.

In this manner, a capacitor between the scanning line GL and the common electrode COM can be decreased in at least the red sub-pixel SxR and the blue sub-pixel SxB, so that the capacitor Cgc expressed by the equation (1) is decreased. Therefore, the parasitic capacitance or the wiring resistance related to the scanning line GL is decreased, and the period Trg1 for which the rise of the electric potential of the gate electrode is delayed when the electric potential of the scanning signal supplied to the scanning line GL rises or the period Trf1 for which the drop of the electric potential of the gate electrode is delayed when the electric potential of the scanning signal supplied to the scanning line GL drops. Therefore, the high resolution of the pixel and the large size of the display region is easily achieved.

Furthermore, the parasitic capacitance or the wiring resistance related to the common electrode COM is decreased, and a period is shortened, the period being taken for the return of the electric potential of the common electrode COM to an electric potential before the change of the electric potential of the signal line SL after the change of the electric potential of the common electrode COM in accordance with the change of the electric potential of the signal line SL. Also in this case, the high resolution of the pixel and the large size of the display region is easily achieved.

Furthermore, in the present first embodiment, it is not required to increase the width of the light shielding film LS in comparison with the first comparative example. Therefore, in the present first embodiment, the aperture ratio does not decrease in comparison with the first comparative example, and the luminance of a displayed image does not decrease. That is, in the present first embodiment, even in the case of the high resolution of the pixel or the case of the large size of the display region, the load related to the scanning line GL can be decreased and the load related to the common electrode COM can be decreased without the decrease in the aperture ratio of each sub-pixel Sx.

First Modification Example of the Present Embodiment

Figure 13:
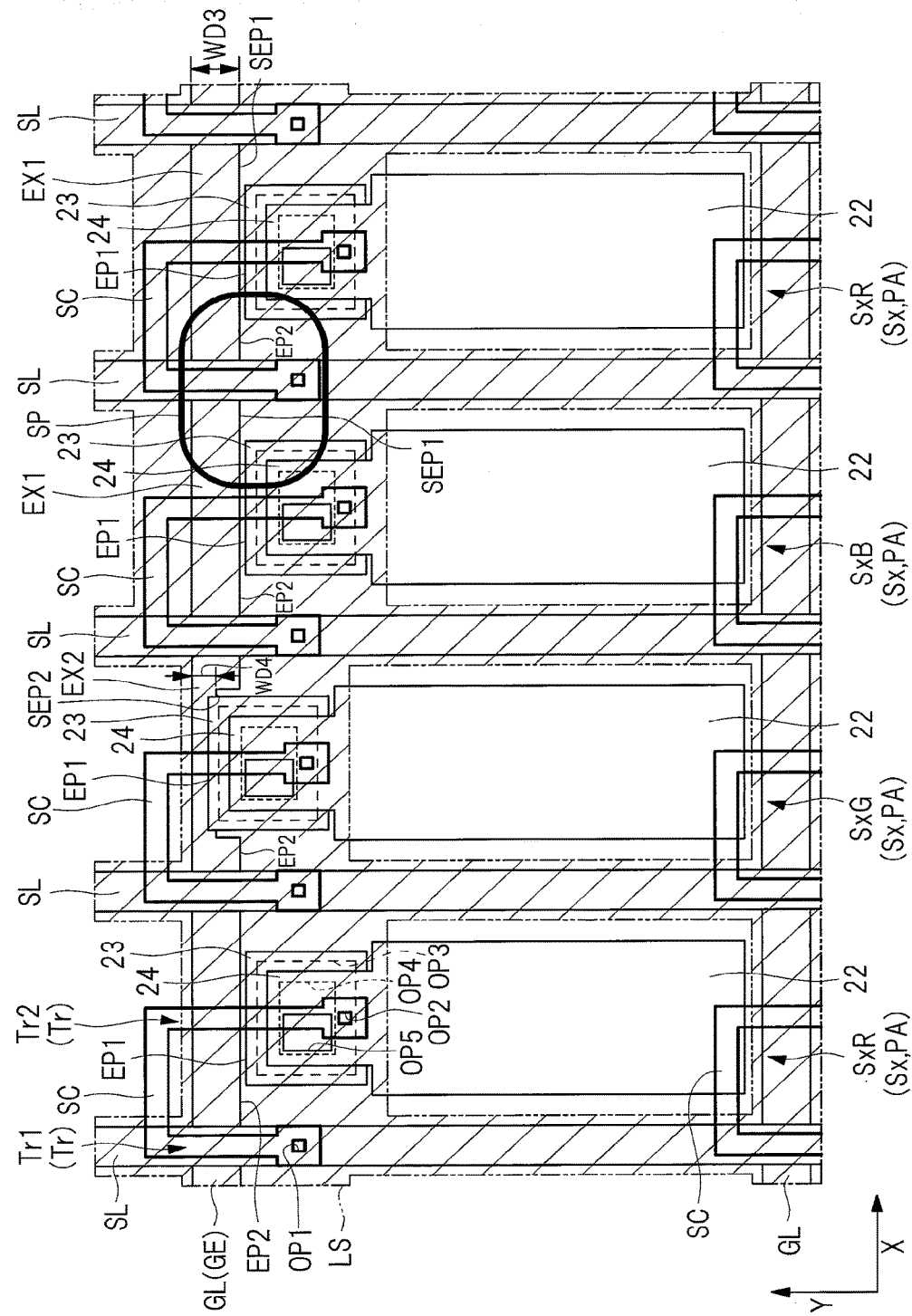
FIG. 13 is a plan view illustrating a configuration of a pixel of a display apparatus according to a first modification example of the first embodiment.

Next, a first modification example of the present first embodiment will be described. FIG. 13 is a plan view illustrating a configuration of a pixel of a display apparatus according to the first modification example of the first embodiment.

In the present first modification example, by removing a portion of the scanning line GL on the pedestal electrode 23 side in the green pixel region PA, the overlap width between a portion of the scanning line GL arranged in the green pixel region PA and the pedestal electrode 23 in a plan view is small.

In the present first modification example, the scanning line GL that drives the transistor Tr included in the red sub-pixel SxR is arranged on the positive side of the pedestal electrode 23 in the Y-axis direction and includes an extension (first extension) EX1 extending in the X-axis direction. Furthermore, the scanning line GL that drives the transistor Tr included in the green sub-pixel SxG is arranged on the positive side of the pedestal electrode 23 in the Y-axis direction and includes an extension (second extension) EX2 extending in the X-axis direction. A width WD4 of the extension EX2 in the Y-axis direction is smaller than a width WD3 of the extension EX1 in the Y-axis direction, and a negative-side side end portion (first side end portion) SEP1 of the extension EX1 in the Y-axis direction is formed so as to be closer to the negative side in the Y-axis direction than a negative-side side end portion (second side end portion) SEP2 of the extension EX2 in the Y-axis direction. Note that the blue sub-pixel SxB is as similar to the red sub-pixel SxR.

Such a case has the overlap width between the portion of the scanning line GL arranged in the green pixel region PA and the pedestal electrode 23 in a plan view which is smaller than the overlap width in a case that the width WD4 of the extension EX2 is equal to the width WD3 of the extension EX1 and that the side end portion SEP1 is provided at the same position as the side end portion SEP2 in the Y-axis direction. Therefore, also in the green sub-pixel SxG, the capacitor Ca (see FIG. 7) between the scanning line GL and the pedestal electrode 23 can be decreased as similar to the red sub-pixel SxR and the blue sub-pixel SxB, so that the capacitor Cgc expressed by the equation (1) can be further decreased.

If the width of the scanning line GL in the Y-axis direction is small in all of the color sub-pixels Sx for red, green, and blue, there is a risk of increase in a resistance of the scanning line GL. Alternatively, the gate length of the transistor Tr2 on the pedestal electrode 23 side becomes short, which results in increase in an off-leak electric current, and therefore, there is a risk of deterioration of the quality of the image displayed in the display region.

On the other hand, in the present first modification example, the width of the scanning line GL in the Y-axis direction which corresponds to the green sub-pixel SxG serving as the second pixel is decreased. Therefore, a degree of the increase in the resistance of the scanning line GL can be decreased. Furthermore, in the red sub-pixel SxR and the blue sub-pixel SxB, the gate length of the transistor Tr2 on the pedestal electrode 23 side is not short, and therefore, the increase in the off-leak electric current can be prevented.

Second Modification Example of the Present Embodiment

Figure 14:
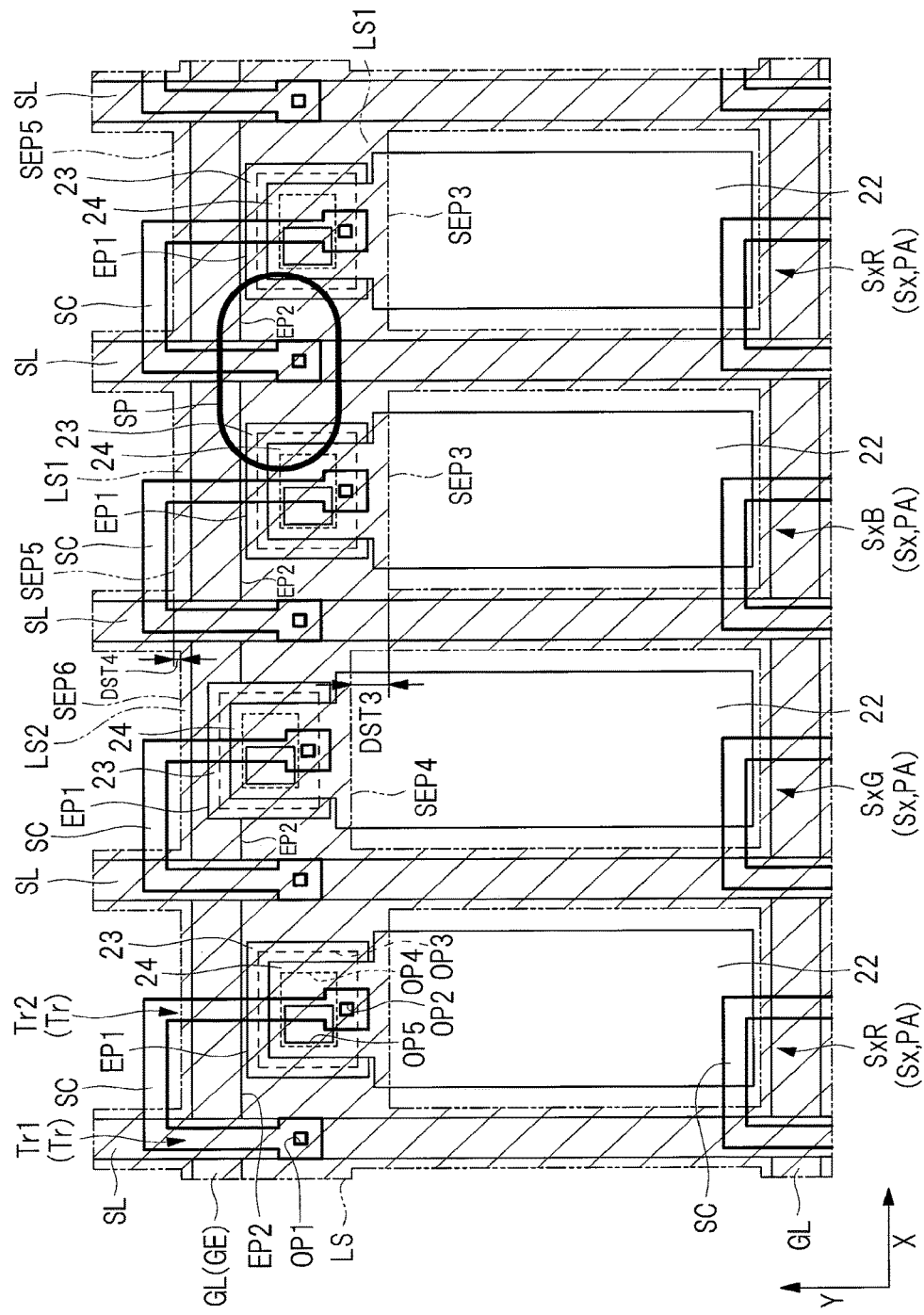
FIG. 14 is a plan view illustrating a configuration of a pixel of a display apparatus according to a second modification example of the first embodiment.

Next, a second modification example of the present first embodiment will be described. FIG. 14 is a plan view illustrating a configuration of a pixel of a display apparatus according to the second modification example of the first embodiment.

In the present second modification example, in a wider amount of the width of the light shielding film LS in the red sub-pixel SxR than the width of the light shielding film LS in the green sub-pixel SxG, a side of the scanning line GL on which the spacer SP is arranged is larger than a side of the scanning line GL opposite to the side on which the spacer SP is arranged. Furthermore, in a wider amount of the width of the light shielding film LS in the blue sub-pixel SxB than the width of the light shielding film LS in the green sub-pixel SxG, a side of the scanning line GL on which the spacer SP is arranged is larger than a side of the scanning line GL opposite to the side on which the spacer SP is arranged.

In the present second modification example, the light shielding film LS includes a light shielding portion (first light shielding portion) LS1 and a light shielding portion (second light shielding portion) LS2. In a plan view, the light shielding portion LS1 is superposed with the spacer SP, the connection wiring 24, and the pedestal electrodes 23 included in the red sub-pixel SxR and the blue sub-pixel SxB. In a plan view, the light shielding portion LS2 is superposed with the connection wiring 24 and the pedestal electrode 23 included in the green sub-pixel SxG.

A negative-side side end portion (third side end portion) SEP3 of the light shielding portion LS1 in the Y-axis direction extends closer to the negative side in the Y-axis direction than a negative-side side end portion (fourth side end portion) SEP4 of the light shielding portion LS2 in the Y-axis direction. Furthermore, a positive-side side end portion (fifth side end portion) SEP5 of the light shielding portion LS1 in the Y-axis direction extends closer to the positive side in the Y-axis direction than a positive-side side end portion (sixth side end portion) SEP6 of the light shielding portion LS2 in the Y-axis direction. A distance DST3 in the Y-axis direction between the side end portion SEP3 and the side end portion SEP4 is larger than a distance DST4 in the Y-axis direction between the side end portion SEP5 and the side end portion SEP6. In this manner, the light shielding film LS and the spacer SP can be arranged so that the aperture ratio in a sub-pixel Sx adjacent to the red sub-pixel SxR on the positive side in the Y-axis direction increases.

Third Modification Example of the Present Embodiment

Figure 15:
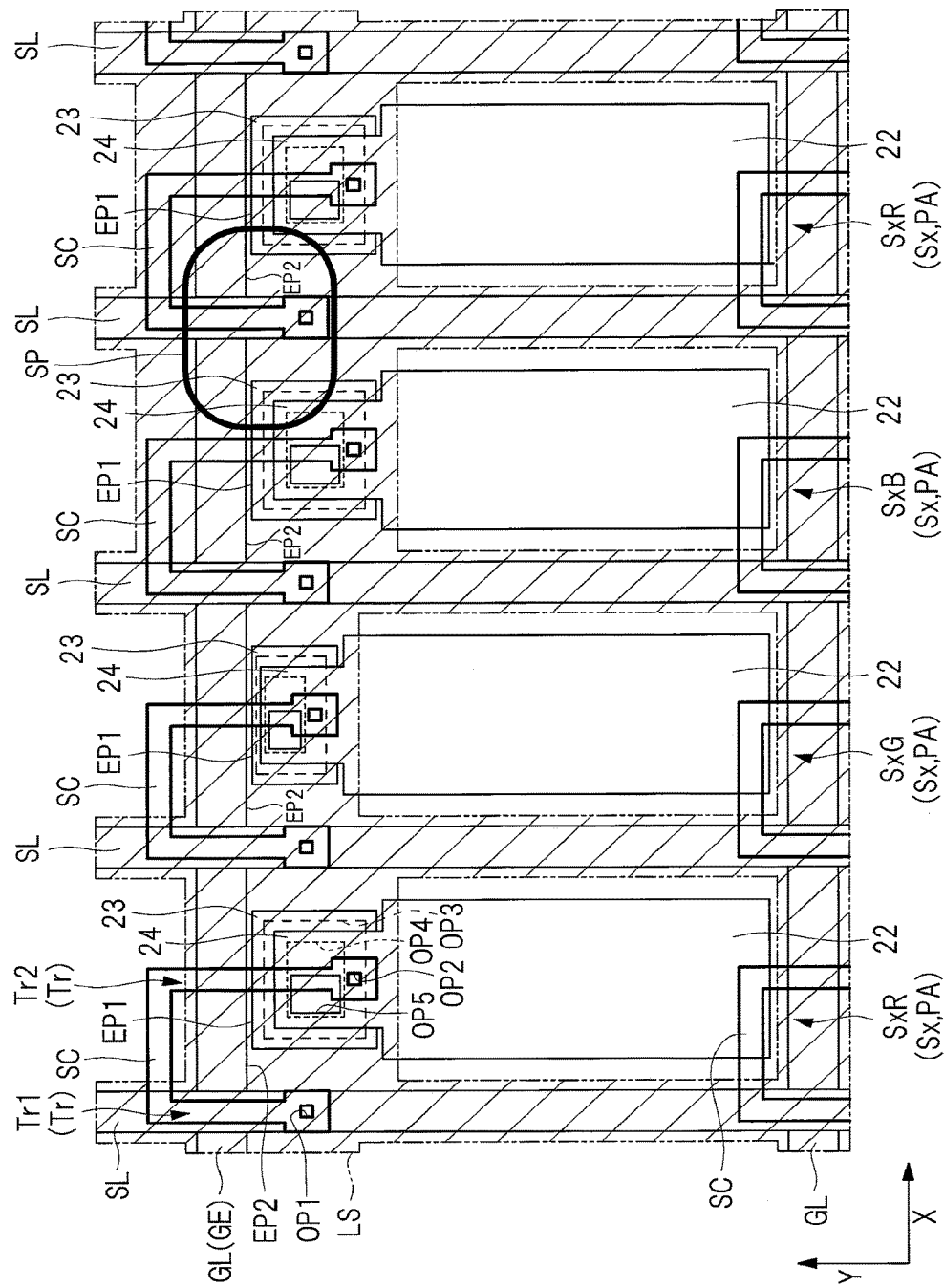
FIG. 15 is a plan view illustrating a configuration of a pixel of a display apparatus according to a third modification example of the first embodiment.

Next, a third modification example of the present first embodiment will be described. FIG. 15 is a plan view illustrating a configuration of a pixel of a display apparatus according to the third modification example of the first embodiment.

In the present third modification, by removing a part of the pedestal electrode 23 or the connection wiring 24 in the green sub-pixel SxG, the pedestal electrode 23 or the connection wiring 24 is spaced away from the scanning line GL.

In the present third modification example, the length in the Y-axis direction of the pedestal electrode 23 included in the green sub-pixel SxG is shorter than the length in the Y-axis direction of the pedestal electrode 23 included in the red sub-pixel SxR. Alternatively, the length in the Y-axis direction of the connection wiring 24 included in the green sub-pixel SxG is shorter than the length in the Y-axis direction of the connection wiring 24 included in the red sub-pixel SxR.

Accordingly, in the green sub-pixel SxG, the pedestal electrode 23 or the connection wiring 24 is spaced away from the scanning line GL. Alternatively, even when the pedestal electrode 23 and the connection wiring 24 overlap the scanning line GL in a plan view in the green sub-pixel SxG, the overlap length in the Y-axis direction between the pedestal electrode 23 or the connection wiring 24 and the scanning line GL in a plan view can be made shorter than that in the first embodiment. Therefore, also in the green sub-pixel SxG, a capacitor between the scanning line GL and the pedestal electrode 23 can be decreased as similar to the red sub-pixel SxR and the blue sub-pixel SxB, so that the capacitor Cgc expressed by the equation (1) can be decreased.

In the present third modification, note that the length in the Y-axis direction of the pedestal electrode 23 included in the green sub-pixel SxG may be shorter than the length in the Y-axis direction of the pedestal electrode 23 included in the blue sub-pixel SxB. Alternatively, the length in the Y-axis direction of the connection wiring 24 included in the green sub-pixel SxG may be shorter than the length in the Y-axis direction of the connection wiring 24 included in the blue sub-pixel SxB.

Second Embodiment

In the first embodiment, the example of application of the display apparatus to a liquid crystal display apparatus has been described. In contrast with this example, in the second embodiment, an example of application of the display apparatus to a liquid crystal display apparatus with a position coordinate detection function of detecting touch of a human finger or others will be described. Here, the liquid crystal display apparatus with the position coordinate detection function is a liquid crystal display apparatus in which a detection electrode for position coordinate detection is provided on either the array substrate or the opposite substrate included in the display apparatus. Furthermore, the second embodiment will further describe an in-cell type liquid crystal display apparatus with a position coordinate detection function having such a feature that a common electrode is provided so as to operate as a common electrode of a position coordinate detection panel.

The following is explanation for a different point of the display apparatus according to the second embodiment from the display apparatus according to the first embodiment.

<Module>

Figure 16:
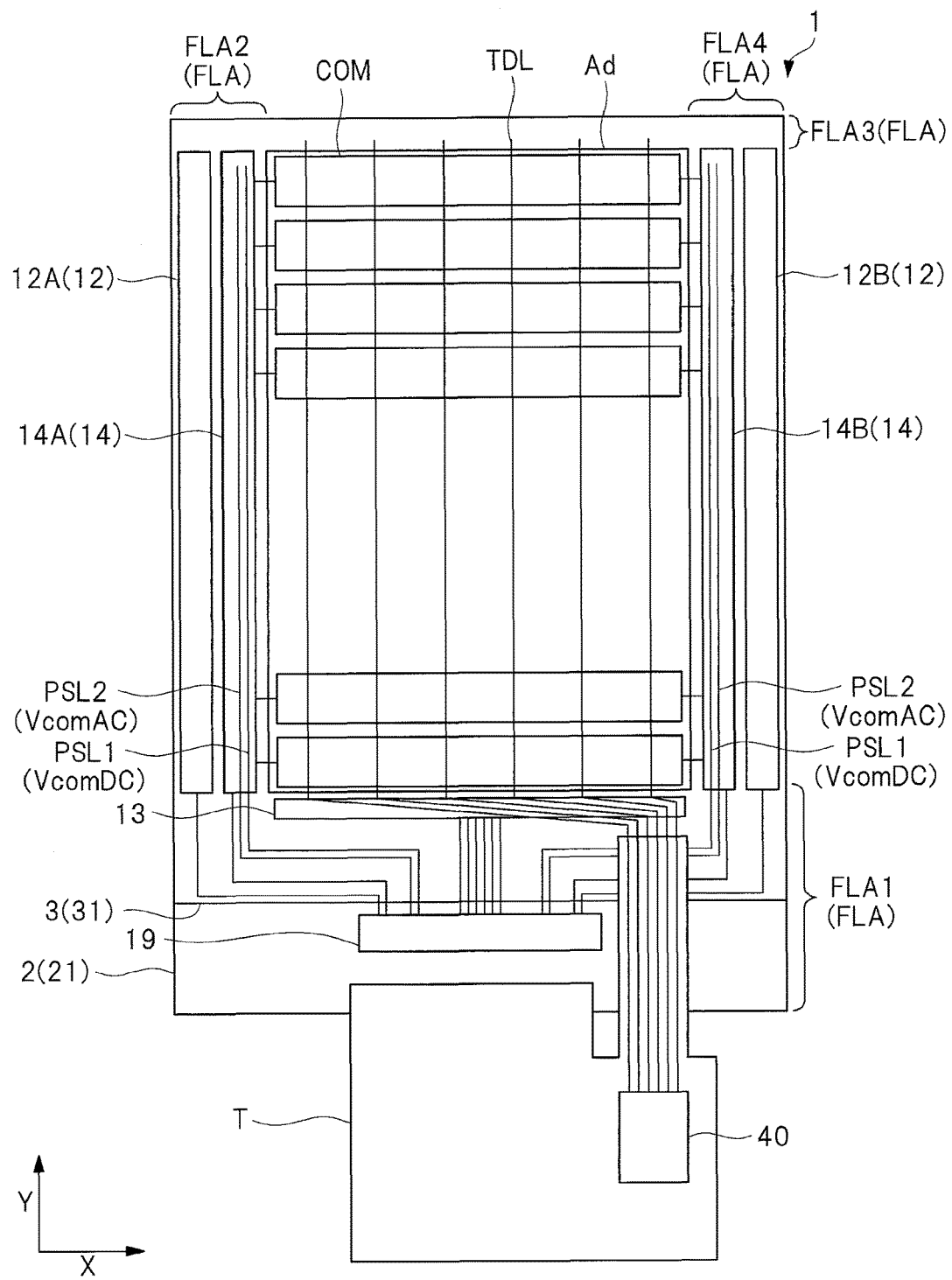
FIG. 16 is a plan view illustrating an example of a module on which a display apparatus according to a second embodiment is mounted.

FIG. 16 is a plan view illustrating an example of a module on which the display apparatus according to the second embodiment is mounted.

As illustrated in FIG. 16, the display apparatus 1 has an array substrate 2 including a substrate 21, an opposite substrate 3 including a substrate 31, and a flexible printed board T.

The array substrate 2 according to the present second embodiment can be similar to the array substrate 2 in the first embodiment except for the shape of a common electrode COM. Furthermore, the opposite substrate 3 according to the present second embodiment can be similar to the opposite substrate 3 in the first embodiment except for the fact that a detection electrode TDL is provided.

In the present second embodiment, the display apparatus 1 has a plurality of common electrodes COM and a plurality of detection electrodes TDL as different from the first embodiment. The plurality of common electrodes COM and the plurality of detection electrodes TDL are electrodes for position coordinate detection, and an input position is detected based on an electrostatic capacitance between each of the plurality of common electrodes COM and each of the plurality of detection electrodes TDL. Each of the plurality of common electrodes COM extends in the X-axis direction and is aligned in the Y-axis direction. Each of the plurality of detection electrodes TDL extends in the Y-axis direction and is aligned in the X-axis direction in a plan view.

Also in the present second embodiment, gate drivers 12A and 12B serving as the gate driver 12 are provided on the substrate 21 as similar to the first embodiment. On the other hand, in the present second embodiment, common electrode drivers 14A and 14B serving as the common electrode driver 14 are provided on the substrate 21 as different from the first embodiment. The gate drivers 12A and 12B and the common electrode drivers 14A and 14B are provided in a frame region FLA. Specifically, the gate driver 12A and the common electrode driver 14A are provided in a frame region FLA2, and the gate driver 12B and the common electrode driver 14B are provided in a frame region FLA4.

In an operation of the position coordinate detection, a detection driving signal Vcom is supplied to each of the plurality of common electrodes COM by the common electrode drivers 14A and 14B. An output of each of the plurality of detection electrodes TDL is connected via the flexible printed board T to a position coordinate detecting unit 40 mounted on the flexible printed board T. It is only required that the flexible printed board T is a terminal, and the flexible printed board T is not limited to a flexible printed board.

The common electrode drivers 14A and 14B are connected to both of the positive side and the negative side in the X-axis direction of each of the plurality of common electrodes COM aligned in the Y-axis direction. To the common electrode drivers 14A and 14B, for example, a display driving signal VcomDC serving as a display driving signal Vcom is supplied from a driving signal generating unit (illustration is omitted) included in a COG 19 via power supply wiring PSL1. Furthermore, to the common electrode drivers 14A and 14B, a detection driving signal VcomAC serving as a driving signal Vcom for the position coordinate detection is supplied via a power supply wiring PSL2. That is, the display driving signal VcomDC is supplied to the power supply wiring PSL1, and the detection driving signal VcomAC is supplied to the power supply wiring PSL2.

The power supply wiring PSL1 is arranged on the display region Ad of the power supply wiring PSL2. That is, the power supply wiring PSL2 is arranged in the frame region FLA2 on the negative side of the power supply wiring PSL1 in the X-axis direction, and the power supply wiring PSL2 is arranged in the frame region FLA4 on the positive side of the power supply wiring PSL1 in the X-axis direction. In such arrangement, the display driving signal VcomDC supplied by the power supply wiring PSL1 stabilizes an electric potential state in an end portion of the display region Ad. Therefore, the display is stabilized in specifically a case of usage of liquid crystals of a horizontal electric field mode.

<Display Apparatus with Position Coordinate Detection Function>

Figure 17:
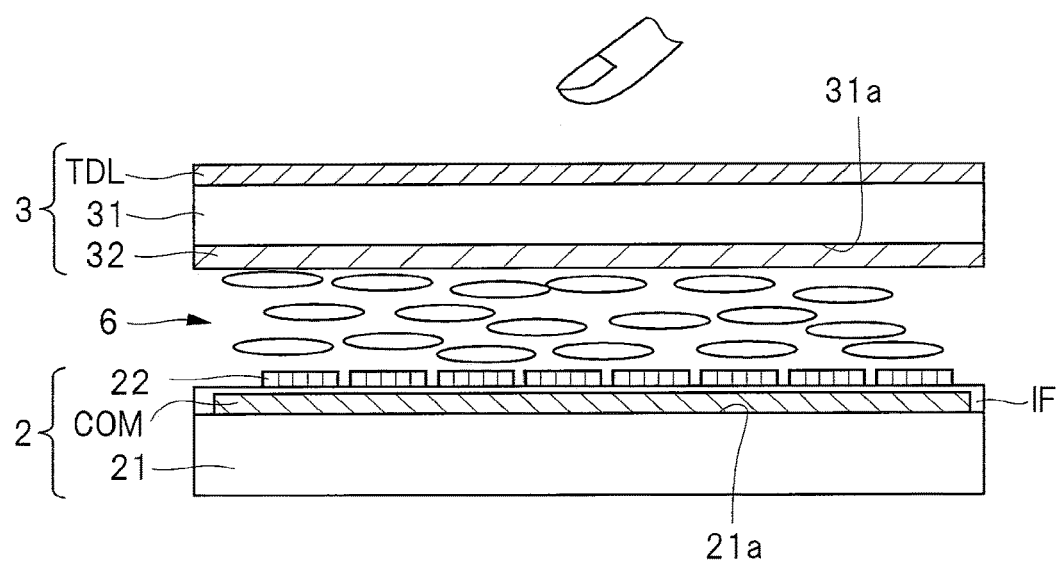
FIG. 17 is a cross-sectional view illustrating the display apparatus according to the second embodiment.

Next, with reference to FIGS. 16 and 17, an example of a configuration of the display apparatus according to the present second embodiment will be described in detail. FIG. 17 is a cross-sectional view illustrating the display apparatus according to the second embodiment.

As described above, the array substrate 2 according to the present second embodiment can be similar to the array substrate 2 according to the first embodiment except for a shape of the common electrode COM. Furthermore, the opposite substrate 3 according to the present second embodiment can be similar to the opposite substrate 3 according to the first embodiment except for the fact that the detection electrode TDL is provided.

Also in the present second embodiment, a plurality of pixel electrodes 22 are provided inside a plurality of respective sub-pixels Sx aligned in a matrix form in the X-axis direction and the Y-axis direction inside the display region Ad in a plan view as similar to the description in the first embodiment with reference to FIGS. 4 and 5. Accordingly, the plurality of pixel electrodes 22 are aligned in a matrix form in the X-axis direction and the Y-axis direction.

Each of the plurality of common electrodes COM is provided between the substrate 21 and the pixel electrodes 22. Also, the plurality of common electrodes COM is provided so as to overlap the plurality of pixel electrodes 22 in a plan view, respectively. A voltage is applied between each of the plurality of pixel electrodes 22 and each of the plurality of common electrodes COM so that an electric field is formed between each of the plurality of pixel electrodes 22 and each of the plurality of common electrodes COM, i.e., in a liquid crystal element LC (see FIGS. 4 and 10) corresponding to each of the plurality of sub-pixels Sx, and therefore, an image is displayed in the display region Ad. At this time, a capacitor Cap (see FIG. 4) is formed between each of the plurality of common electrodes COM and each of the plurality of pixel electrodes 22, and the capacitor Cap functions as a storage capacitor.

The plurality of common electrodes COM may be provided on a side opposite to the substrate 21 with the pixel electrodes 22 interposed therebetween.

In this display operation, the common electrode drivers 14A and 14B serving as the common electrode driver 14 drive the common electrodes COM by supplying the display driving signal VcomDC. In the display region Ad, each of the plurality of common electrodes COM extends in the X-axis direction and is aligned in the Y-axis direction.

As described above, each of a plurality of scanning lines GL extends in the X-axis direction and is aligned in the Y-axis direction in the display region Ad, and therefore, a direction in which each of the plurality of common electrodes COM extends may be parallel with a direction in which each of the plurality of scanning lines GL extends. However, the direction in which each of the plurality of common electrodes COM extends is not limited, and, for example, the direction in which each of the plurality of common electrodes COM extends may be parallel with a direction in which each of a plurality of signal lines SL extends.

The common electrode COM in the display apparatus 1 according to the present second embodiment operates as a display common electrode, and operates as a common electrode for the position coordinate detection. In other words, the common electrode COM also functions as the position coordinate detection electrode that detects contact or approach of an object. Note that the common electrode COM is superposed with the scanning lines GL although not illustrated in FIG. 16.

Each of the plurality of detection electrodes TDL extends in a direction (Y-axis direction) that intersects the direction (X-axis direction) in which each of the plurality of common electrodes COM extends in a plan view. In other words, the plurality of detection electrodes TDL are spaced apart from each other so as to intersect the plurality of common electrodes COM in a plan view, respectively. The plurality of detection electrodes TDL are arranged so as to face the plurality of common electrodes COM in a direction perpendicular to an upper surface 21a (see FIG. 17) of the substrate 21 included in the array substrate 2, respectively.

Each of the plurality of detection electrodes TDL is connected to the position coordinate detecting unit 40. An electrostatic capacitance is generated at an intersection between each of the plurality of common electrodes COM and each of the plurality of detection electrodes TDL in a plan view. An input position is detected based on the electrostatic capacitance between each of the plurality of common electrodes COM and each of the plurality of detection electrodes TDL. That is, the position coordinate detecting unit 40 detects the input position based on the electrostatic capacitance between each of the plurality of common electrodes COM and each of the plurality of detection electrodes TDL.

In the display apparatus 1 according to the present second embodiment, in the position coordinate detection operation, for example, one or more common electrodes COM are sequentially selected in, for example, the Y-axis direction by the common electrode drivers 14. The detection driving signal VcomAC is supplied and input to the selected one or more common electrodes COM, and a detection signal for detecting the input position is generated and output from the detection electrodes TDL.

In a plan view, the plurality of common electrodes COM and the plurality of detection electrodes TDL that intersect each other form an electrostatic capacitance type position coordinate detection sensor aligned in a matrix form. By scanning the entire detection surface of the electrostatic capacitance type position coordinate detection sensor, the position of the contact or approach of the finger or others can be detected.

<Overlap Between Pedestal Electrode and Signal Electrode in Plan View>

The overlap between the pedestal electrode 23 and the scanning line GL in a plan view in the present second embodiment can be similar to the overlap between the pedestal electrode 23 and the scanning line GL in the first embodiment.

<Load Related to Scanning Line and Common Electrode>

Next, a load related to the scanning line GL and the common electrode COM will be described in comparison with a display apparatus according to a second comparative example. In the display apparatus according to the second comparative example, the layout of the pedestal electrode 23 and the connection wiring 24 is different from the layout of the pedestal electrode 23 and the connection wiring 24 in the display apparatus according to the second embodiment.

The load related to the scanning line GL and the common electrode COM in the present second embodiment can be also described in comparison with the display apparatus according to the second comparative example as similar to the load related to the scanning line GL and the common electrode COM in the first embodiment. Furthermore, an equivalent circuit of the display apparatus according to the second comparative example can be also described with reference to the circuit diagram illustrated in FIG. 10 showing a part of the equivalent circuit of the display apparatus according to the first comparative example.

Also, in the display apparatus according to the second comparative example, by the increase in a capacitor Cg1, a capacitor Cg2, a capacitor Cgc, or a resistor Rg1 illustrated in FIG. 10, the parasitic capacitance or the wiring resistance related to the scanning line GL increases, and the load related to the scanning line GL increases as similar to the display apparatus according to the first comparative example. Furthermore, the parasitic capacitance or the wiring resistance related to the common electrode COM increases, and the load related to the common electrode COM increases.

Also in the display apparatus according to the second comparative example, the pedestal electrode 23 and the scanning line GL overlap each other in a plan view in all of the color sub-pixels Sx for red, green, and blue as similar to the display apparatus according to the first comparative example illustrated in FIG. 8. Therefore, a capacitor Ca (see FIG. 9) increases, and the capacitor Cgc expressed by the equation (1) increases.

Therefore, the load such as the parasitic capacitance or the wiring resistance related to the scanning line GL increases, and a period Trg1 or a period Trf1 illustrated in FIG. 11 tends to be long. Furthermore, the load such as the parasitic capacitance or the wiring resistance related to the common electrode COM increases, and return from the change of the electric potential of the common electrode COM tends to be delayed as illustrated in FIG. 12.

Figure 18:
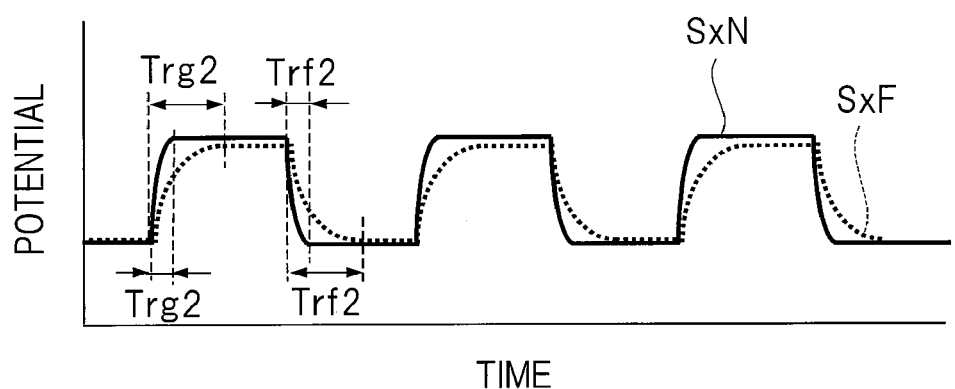
FIG. 18 is a graph schematically illustrating an electric potential of a common electrode obtained when a signal waveform is supplied to a scanning line.

FIG. 18 is a graph schematically illustrating the electric potential of a common electrode obtained when a signal waveform is supplied to a scanning line.

In the display apparatus according to the second comparative example, as illustrated in FIG. 18, the electric potential of the driving signal supplied to the common electrode COM periodically changes when, for example, a driving signal for the position coordinate detection is supplied to the common electrode COM as different from the display apparatus according to the first comparative example. By the increase in a capacitor Cc1, a capacitor Cgc, or a resistor Rc1 illustrated in FIG. 10, the parasitic capacitance or the wiring resistance related to the common electrode COM increases, and a period Trg2 is long, the period Trg2 for which the rise of the electric potential of the common electrode COM in each sub-pixel Sx is delayed in accordance with the rise of the electric potential of the driving signal supplied to the common electrode COM, and therefore, power consumption increases. Furthermore, a period Trf2 is long, the period Trf2 for which the drop of the electric potential of the common electrode COM in each sub-pixel Sx is delayed in accordance with the drop of the electric potential of the driving signal supplied to the common electrode COM, and therefore, power consumption increases. Accordingly, detection properties such as detection sensitivity in the position coordinate detection decrease.

The period Trg2 in a sub-pixel SxF is longer than the period Trg2 in a sub-pixel SxN, and the period Trf2 in the sub-pixel SxF is longer than the period Trf2 in the sub-pixel SxN. That is, the parasitic capacitance or the wiring resistance related to the common electrode COM tends to increase more in a sub-pixel Sx farther from a control device such as the COG 19. Therefore, the phenomena of the increase in the power consumption and the decrease in detection properties such as the detection sensitivity in the position coordinate detection tend to occur in accordance with the high resolution of the pixel or the large size of the display region. Especially in the detection of the input position using the common electrodes COM, more precise electric potential control than image display is required, and therefore, there is a risk that the increase in the parasitic capacitance or the wiring resistance of the common electrode COM leads to a remarkable deterioration in quality. Therefore, it is advisable to apply the invention for decreasing the parasitic capacitance or the wiring resistance described in the present specification.

<Main Feature and Effect of the Present Embodiment>

Meanwhile, also in the present second embodiment, a distance in the Y-axis direction between the pedestal electrode 23 and the scanning line GL that drives the transistor Tr in a plan view in the red sub-pixel SxR is longer than a distance in the Y-axis direction between the pedestal electrode 23 and the scanning line GL that drives the transistor Tr in a plan view in the green sub-pixel SxG as similar to the first embodiment. Furthermore, the superposed width of the light shielding film LS with the red pixel region PA and the blue pixel region PA in the Y-axis direction is larger than the superposed width of the light shielding film LS with the green pixel region PA in the Y-axis direction.

In this manner, even in the high resolution of the pixel or the large size of the display region, the load related to the scanning line GL can be decreased and the load related to the common electrode COM can be decreased without the decrease in the aperture ratio of each sub-pixel Sx as similar to the first embodiment.

On the other hand, in the present second embodiment, the parasitic capacitance or the wiring resistance related to the common electrode COM decreases, and the period Trg2 is shortened, the period Trg2 for which the rise of the electric potential of the common electrode COM in each sub-pixel Sx is delayed in accordance with the rise of the electric potential of the driving signal supplied to the common electrode COM as different from the first embodiment. Alternatively, the period Trf2 is shortened, the period Trf2 for which the drop of the electric potential of the common electrode COM in each sub-pixel Sx is delayed in accordance with the drop of the electric potential of the driving signal supplied to the common electrode COM. Therefore, even in the high resolution of the pixel and the large size of the display region, the power consumption can be decreased, and the detection properties such as the detection sensitivity in the position coordinate detection can be improved.

Also in the present second embodiment, note that the one to which a modification example as similar to the first to third modification examples of the first embodiment can be as first to third modification examples of the second embodiment. At this time, each of the first to third modification examples of the second embodiment has effects in relation to the second embodiment that are similar to the effects included in the first to third modification examples of the first embodiment in relation to the first embodiment.

In the foregoing, the invention made by the present inventor has been concretely described based on the embodiments. However, it is needless to say that the present invention is not limited to the foregoing embodiments and various modifications can be made within the scope of the present invention.

In the above-described embodiments, the case of the liquid crystal display apparatus has been exemplified as the disclosure example. However, as another application example, various types of flat-panel display apparatuses such as an organic EL display apparatus, other self-luminous type display apparatus, and an electronic-paper type display apparatus having an electrophoretic element can be exemplified. And, it is needless to say that the present invention is applicable to display apparatuses ranging from small- or middle-sized one to large one without any particular limitation.

In the scope of the idea of the present invention, various modified examples and alteration examples could have been easily thought up by those who skilled in the art, and it would be understood that these various modified examples and alteration examples belong to the scope of the present invention.

For example, the ones obtained by appropriate addition, removal, or design-change of the components to/from/into each of the above-described embodiments by those who skilled in the art or by addition, omitting, or condition-change of the step to/from/into each of the above-described embodiments are also within the scope of the present invention as long as they include the concept of the present invention.

The present invention is effectively applied to a display apparatus.

What is claimed is:

1. A display apparatus including a plurality of first signal lines to which a first signal is supplied as a scanning signal, and a plurality of second signal lines to which a second signal is supplied as an image signal, comprising:
    a first pixel region and a second pixel region that are sectioned by intersection between the plurality of first signal lines and the plurality of second signal lines;
    a first transistor in the first pixel region and a second transistor in the second pixel region driven by the same first signal line;
    a first pixel electrode provided in the first pixel region;
    a second pixel electrode provided in the second pixel region;
    a first conductive electrode of the first transistor;
    a second conductive electrode of the second transistor;
    a first conductive wiring that electrically connects the first conductive electrode and the first pixel electrode;
    a second conductive wiring that electrically connects the second conductive electrode and the second pixel electrode; and
    a light shielding film that is superposed with the first signal line, the first conductive wiring, the second conductive wiring, the first conductive electrode, and the second conductive electrode,
    wherein the plurality of first signal lines extends in a first direction in a plan view the first conductive electrode is adjacent to the first signal line driving the first transistor in a plan view,
    the second conductive electrode is adjacent to the first signal line driving the second transistor a plan view,
    a distance in the second direction between the first conductive electrode and the first signal line in a plan view is longer than a distance in the second direction between the second conductive electrode and the first signal line in a plan view, and
    a superposed width of the light shielding film with the first pixel region in the second direction is larger than a superposed width of the light shielding film with the second pixel region in the second direction.

2. The display apparatus according to claim 1 further comprising:
    a plurality of first pixels; and
    a second pixel,
    wherein the first pixel includes:
        the first pixel region;
        the first conductive electrode;
        the first conductive wiring; and
        the first transistor,
    the second pixel includes:
        the second pixel region;
        the second conductive electrode;
        the second conductive wiring; and
        the second transistor,
    the plurality of first pixels are aligned in the first direction,
    the second pixel is adjacent to the first pixel that is arranged at an end of layout of the plurality of first pixels,
    the second signal line is interposed between two of the first pixels adjacent to each other, and
    the second signal line is interposed between the second pixel and the first pixel adjacent to the second pixel.

3. The display apparatus according to claim 2,
    wherein the first conductive electrode is adjacent to the first signal line on a first side in a second direction that intersects the first direction in a plan view,
    the first signal line that drives the first transistor included in the first pixel is arranged on a side of the first conductive electrode opposite to the first side, and includes a first extension that extends in the first direction,
    the first signal line that drives the second transistor included in the second pixel is arranged on a side of the second conductive electrode opposite to the first side, and includes a second extension that extends in the first direction,
    a width of the second extension in the second direction is smaller than a width of the first extension in the second direction, and
    a first side end portion of the first extension on the first side is provided closer to the first side than a second side end portion of the second extension on the first side.

4. The display apparatus according to claim 2 further comprising:
    a first substrate;
    a second substrate arranged at a position facing the first substrate; and
    a spacer that is provided between the first substrate and the second substrate and that keeps a distance between the first substrate and the second substrate,
    wherein the plurality of first pixels and the second pixel are provided on the first substrate, and
    the spacer overlaps the second signal line of a portion interposed between two of the first pixels adjacent to each other in a plan view.

5. The display apparatus according to claim 4,
wherein the first conductive electrode is adjacent to the first signal line on a first side in a second direction that intersects the first direction a plan view,
the spacer overlaps the first signal line connected to two of the first transistors included in two of the first pixels adjacent to each other in a plan view, respectively, and
center of the spacer in the second direction is arranged on the first side of the first signal line in the second direction that is connected to two of the first transistors included in two of the first pixels adjacent to each other, respectively.

6. The display apparatus according to claim 4,
wherein a length of the spacer in the first direction is larger than a width of the spacer in the second direction.

7. The display apparatus according to claim 5,
wherein the light shielding film includes:
  a first light shielding portion that is superposed with the spacer, the first conductive wiring, and the first conductive electrode in a plan view; and
  a second light shielding portion that is superposed with the second conductive wiring and the second conductive electrode included in the second pixel,
  a third side end portion of the first light shielding portion on the first side extends closer to the first side than a fourth side end portion of the second light shielding portion on the first side,
  a fifth side end portion of the first light shielding portion on a side opposite to the first side extends closer to a side opposite to the first side than a sixth side end portion of the second light shielding portion on a side opposite to the first side, and
  a distance in the second direction between the third side end portion and the fourth side end portion is larger than a distance in the second direction between the fifth side end portion and the sixth side end portion.

8. The display apparatus according to claim 2,
wherein the first pixel displays white or blue.

9. The display apparatus according to claim 2,
wherein the second pixel displays green.

10. The display apparatus according to claim 1,
wherein a length of the second conductive wiring in the second direction is shorter than a length of the first conductive wiring in the second direction, or a length of the second conductive electrode in the second direction is shorter than a length of the first conductive electrode in the second direction.

11. The display apparatus according to claim 1 comprising:
a common electrode that forms an electric field between the first pixel electrode and the second pixel electrode,
wherein the common electrode is superposed with the first signal line, and
the common electrode also serves as a position coordinate detection electrode that detects contact or approach of an object.

* * * * *